(12) United States Patent
Lee et al.

(10) Patent No.: US 7,951,636 B2
(45) Date of Patent: May 31, 2011

(54) METHOD FOR FABRICATING MICRO-ELECTRO-MECHANICAL SYSTEM (MEMS) DEVICE

(75) Inventors: Chien-Hsing Lee, Hsinchu County (TW); Tsung-Min Hsieh, Taipei County (TW)

(73) Assignee: Solid State System Co. Ltd., Hsinchu (TW)

( * ) Notice: Subject to any disclaimer, the term of this patent is extended or adjusted under 35 U.S.C. 154(b) by 0 days.

(21) Appl. No.: 12/235,549

(22) Filed: Sep. 22, 2008

(65) Prior Publication Data
US 2010/0072561 A1 Mar. 25, 2010

(51) Int. Cl.
*H01L 21/00* (2006.01)

(52) U.S. Cl. .......... 438/53; 438/700; 257/254; 257/419; 257/E21.52

(58) Field of Classification Search .................. None
See application file for complete search history.

(56) References Cited

U.S. PATENT DOCUMENTS

| | | | |
|---|---|---|---|
| 5,490,220 A | 2/1996 | Loeppert | |
| 5,870,482 A | 2/1999 | Loeppert et al. | |
| 5,888,412 A * | 3/1999 | Sooriakumar et al. | 216/41 |
| 6,535,460 B2 | 3/2003 | Loeppert et al. | |
| 6,847,090 B2 | 1/2005 | Loeppert | |
| 6,936,524 B2 * | 8/2005 | Zhu et al. | 438/459 |
| 7,049,051 B2 | 5/2006 | Gabriel et al. | |
| 7,439,093 B2 * | 10/2008 | Beaudry | 438/48 |
| 7,536,769 B2 * | 5/2009 | Pedersen | 29/594 |
| 7,570,773 B2 * | 8/2009 | Ohbayashi et al. | 381/175 |
| 2005/0241944 A1 * | 11/2005 | Dehe et al. | 205/75 |
| 2007/0154040 A1 * | 7/2007 | Chen | 381/174 |
| 2009/0026561 A1 * | 1/2009 | Reichenbach et al. | 257/416 |
| 2009/0169035 A1 * | 7/2009 | Rombach et al. | 381/175 |
| 2009/0273043 A1 * | 11/2009 | Lee et al. | 257/416 |
| 2010/0044808 A1 * | 2/2010 | Dekker et al. | 257/415 |

* cited by examiner

*Primary Examiner* — Marcos D Pizarro
*Assistant Examiner* — Andres Munoz
(74) *Attorney, Agent, or Firm* — Jianq Chyun IP Office

(57) ABSTRACT

A micro-electro-mechanical system (MEMS) device includes a substrate, having a first side and second side, the second side has a cavity and a plurality of venting holes in the substrate at the second side with connection to the cavity. However, the cavity is included in option without absolute need. A structural dielectric layer has a dielectric structure and a conductive structure in the dielectric structure. The structural dielectric layer has a chamber in connection to the cavity by the venting holes. A suspension structure layer is formed above the chamber. An end portion is formed in the structural dielectric layer in fix position. A diaphragm has a first portion of the diaphragm fixed on the suspension structure layer while a second portion of the diaphragm is free without being fixed.

19 Claims, 35 Drawing Sheets

METHOD FOR FABRICATING MICRO-ELECTRO-MECHANICAL SYSTEM (MEMS) DEVICE

BACKGROUND OF THE INVENTION

1. Field of Invention

The present invention relates to a micro-electro-mechanical system (MEMS) technology with semiconductor fabrication technology. More particularly, the present invention relates to a method for fabricating a MEMS device.

2. Description of Related Art

MEMS devices have been widely fabricated using semiconductor fabricating process. However, it is still not easy to be integrated into the standard MOS (metal-oxide semiconductor) process, such as complementary MOS (CMOS) device. In general, a discrete MEMS device and a CMOS ASIC chip are packaged to a single die for application. However, the cost and performance for current technology cause not being popular. It is intended to develop a CMOS MEMS technology, so that the process for fabricating the MEMS can be compatible with the process for fabricating the CMOS device.

MEMS Condenser Device consists of a stiff Backplate and a compliant diaphragm. Conventional the diaphragm is constructed by thin film material and clamped by a surrounding frame. The temperature expansion coefficient and crystal mismatch of the diaphragm material and supporting frame will cause to residual stress existing in the diaphragm. The unrelieved residual stress in the diaphragm will deteriorate the diaphragm compliant.

FIG. 1 is a cross-sectional view, schematically illustrating a conventional structure of MEMS microphone. In FIG. 1, the MEMS microphone includes a substrate 100, such as the silicon substrate. A hard mask layer 101, such as nitride, oxide or metal layer, is optionally formed on the substrate at a backside. The substrate 100 has a cavity 102 and the venting holes 106. A portion 104b of the substrate 100 above the cavity 102 may have the doped layer 104a on the portion 104b of the substrate 100. A structural dielectric layer 108 is formed on the substrate 100. The structural dielectric layer 108 has the dielectric layer and the conductive structure embedded in the dielectric layer. A diaphragm 112 is formed above the substrate 100 in corresponding to the cavity 102. The diaphragm 112 is clamped into the structural dielectric layer 108 at the region 114. As a result, a chamber 110 is formed in connection with the cavity by the venting holes 106. As mentioned above, the diaphragm 112 is clamped in the structural dielectric layer 108 without moving. This cause the poor sensitivity, for example.

SUMMARY OF THE INVENTION

The invention provides a stress free diaphragm MEMS device and a method for fabricating the stress free diaphragm MEMS structure, in which the fabrication process can be compatible between the CMOS and MEMS device. The MEMS device can thereby be compactly integrated with the CMOS device.

The present invention provides a micro-electro-mechanical system (MEMS) device includes a substrate, having a first side and second side, the second side has at least a cavity, and a plurality of venting holes in the substrate at the second side with connection to the cavity. A structural dielectric layer has a dielectric structure and a conductive structure in the dielectric structure. The structural dielectric layer has a chamber in connection the venting holes. A suspension structure layer is formed above the chamber. An end portion is coupled to the structural dielectric layer at a fixed position. A diaphragm has a first portion fixed on the suspension structure layer while a second portion of the diaphragm is free without being fixed.

In an embodiment, for example, the diaphragm can be corrugated and further for example the diaphragm can be corrugated disk.

In an embodiment, for example, the end portion of the suspension structure layer is a circular ring and is inserted into the structural dielectric layer.

In an embodiment, for example, the suspension structure layer has at least a protruding joint structure to hold the first portion of the diaphragm.

In an embodiment, for example, the first portion of the diaphragm being fixed to the suspension structure layer is a protruding portion.

In an embodiment, for example, the suspension structure layer has a corrugated arm.

In an embodiment, for example, the suspension structure layer comprises multiple arms extending from the end portion to a commonly central joint portion.

In an embodiment, for example, the suspension structure layer comprises an end portion ring, inserted in the structural dielectric layer at a fixed position; a middle ring smaller the end portion ring; a central joint portion, for fixing with the diaphragm; and a plurality of holding arms, coupled between the rings and the central joint portion.

In an embodiment, for example, the suspension structure layer comprises: an end portion ring, inserted in the structural dielectric layer at a fixed position; a plurality of joint portions connected from the end portion ring, wherein the joint portions hold the first portion of the diaphragm.

In an embodiment, for example, the suspension structure layer also includes a portion of the structural dielectric layer in the joint portions.

In an embodiment, for example, the suspension structure layer also does not include a portion of the structural dielectric layer in the joint portions.

In an embodiment, for example, the conductive structure in the structural dielectric layer has a sealing ring protruding into the chamber, in overlapping with an end ring portion of the diaphragm.

In an embodiment, for example, the protruding sealing ring is above the substrate and a gap between the protruding sealing ring and the substrate.

In an embodiment, for example, the protruding sealing ring is couple to the substrate.

In an embodiment, for example, the suspension structure layer is bent so as to cause the end portion of the diaphragm to contact the protruding sealing ring.

In an embodiment, for example, the conductive structure in the structural dielectric layer has a plurality of bumps distributed in a ring protruding into the chamber, in overlapping with an end ring portion of the diaphragm.

In an embodiment, for example, the conductive structure in the structural dielectric layer has a conductive ring or a plurality of bumps distributed in a ring protruding into the chamber, in contact with an end ring portion of the diaphragm.

In an embodiment, for example, the suspension structure layer has at least a joint portion extending from the end portion for fixing with the diaphragm, and a portion of the diaphragm are inserted into the structural dielectric layer.

In an embodiment, for example, the conductive structure in the structural dielectric layer has at least a bump protruding into the chamber, in overlapping with an end ring portion of the diaphragm.

The present invention provides a method for fabricating a micro-electro-mechanical system (MEMS) device, comprising: forming a structural dielectric layer over the substrate, wherein the structural dielectric layer has a conductive structure embedded in a first structural dielectric layer; patterning the first dielectric layer of the structural dielectric layer to have a plurality of indent regions; forming a diaphragm structure on the first dielectric layer; forming a second dielectric layer over the first dielectric layer and diaphragm structure, and has an opening to expose a portion of diaphragm; forming a suspension layer over the second dielectric layer, wherein the suspension layer is mechanically coupled with the exposed portion of the diaphragm structure; patterning the suspension layer to have a suspension pattern; patterning the substrate to form cavity and venting hole; performing an isotropic etching process remove a portion of the first dielectric layer to form a chamber in the structural dielectric layer, wherein the chamber in the structural dielectric layer and the cavity in the substrate are connected by the venting holes in the substrate.

In an embodiment, for example, the isotropic etching process removing a portion of the second dielectric layer.

In an embodiment, for example, the method further comprises forming a third dielectric layer over the second dielectric layer, wherein the suspension layer is also covered.

In an embodiment, for example, the method further comprises forming an etching stop layer on the third dielectric layer, wherein the etching stop layer has an opening to expose the third dielectric layer.

In an embodiment, for example, the isotropic etching process removing a portion of the third dielectric layer.

In an embodiment, for example, between the step of forming the second dielectric layer and the step of forming the suspension layer the method further comprises forming a metal plug in the openings in the second dielectric layer, so that the metal plug connected between the second metal layer and the suspension layer.

In an embodiment, for example, a portion of the conductive structure in the structural dielectric layer is exposed to form a protruding ring to the chamber.

The present invention provides a method for forming a moveable corrugated diaphragm structure, comprising: forming a dielectric layer over the substrate; patterning the dielectric layer to have a plurality of indent regions; forming a conductive diaphragm layer; patterning a portion of dielectric layer to release the diaphragm.

In an embodiment, for example, the conductive diaphragm layer comprises a metal or poly layer.

In an embodiment, for example, the step of forming conductive diaphragm layer comprises: forming a first metal layer on the dielectric layer; forming an inter-dielectric layer on the first metal layer; forming a second metal to cover the inter-dielectric layer, wherein the second metal and the first metal enclose the inter-dielectric layer to serve as diaphragm.

In an embodiment, for example, the step of forming the inter-dielectric layer comprises: forming a dielectric layer over the first metal layer; and patterning the dielectric layer into a plurality of dielectric islands on the first metal layer, adjacent to the indent regions.

In an embodiment, for example, the step of forming the inter-dielectric layer comprises: forming a dielectric layer over the first metal layer; and patterning the dielectric layer into a plurality of dielectric islands on the first metal layer, cover a portion of indent region.

In an embodiment, for example, the step of forming the inter-dielectric layer comprises: forming a dielectric layer over the first metal layer being conformal with the indent regions; and patterning the dielectric layer to expose a portion of the first metal layer, wherein a remaining portion of the dielectric layer as the inter-dielectric layer also covers the indent regions.

The present invention provides a method for patterning the substrate to form cavity and venting holes, comprising: forming a first etching mask layer on the substrate at a back surface, wherein the first etching mask layer has a plurality of openings to expose the substrate, which the openings are at positions corresponding to venting holes to be formed later; forming a second etching mask layer on the first etching mask layer is at position corresponding to cavity be formed later; performing an anisotropic etching process to etch the first etching mask layer and the substrate, to expose the first dielectric layer, wherein the substrate has the cavity and the venting holes being formed.

In an embodiment, for example, the anisotropic etching process etch away the first etching mask layer in the middle of etching process.

The present invention provides a method for patterning the substrate to form cavity and venting holes, comprising: forming a first etching mask layer on the substrate at a back surface, wherein the first etching mask layer has at least a opening to expose the substrate, which the opening is at position corresponding to cavity be formed later; forming a second etching mask layer on the substrate are at positions corresponding to venting holes to be formed later; performing an anisotropic etching process to etch the second etching mask layer and the substrate, to expose the first dielectric layer, wherein the substrate has the cavity and the venting holes being formed.

In an embodiment, for example, the anisotropic etching process etches away the second etching mask layer in the middle of etching process.

In an embodiment, for example, the second etching mask also covers the first etching mask.

The present invention provides a method for patterning the substrate to form venting holes, comprising: forming a etching mask layer on the substrate at a back surface, wherein the etching mask layer has a plurality of openings to expose the substrate, which the openings are at positions corresponding to venting holes to be formed later; performing an anisotropic etching process to etch the substrate, to expose the first dielectric layer, wherein the substrate has the venting holes being formed.

The present invention also provides a structure of MEMS device includes a substrate, a structural dielectric layer, a suspension structure layer, and a diaphragm. The substrate has venting holes therein. The structural dielectric layer has a dielectric structure and a conductive structure in the dielectric structure, wherein the structural dielectric layer has a chamber in connection to the venting holes. The suspension structure layer is formed above the chamber, wherein an end portion is formed in the structural dielectric layer at a fixed position. The diaphragm has a first portion fixed on the suspension structure layer while a second portion of the diaphragm is free without being fixed.

The present invention provides a method for fabricating MEMS device, comprising forming a MEMS structure on the substrate; forming a dielectric layer over the MEMS structure; forming a film layer over the dielectric layer; forming an etch stop layer over the film layer; and performing an isotropic etching process to accomplish the MEMS structure, wherein a portion of the film and dielectric layer are also removed. In another further embodiment, the film layer has a low etching rate comparing to the dielectric layer in the isotropic etching process.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

The present invention provides the MEMS structure and method for fabrication MEMS device, in which the MEMS device has the diaphragm being much free for vibration. The sensitivity can be improved. In application for MEMS microphone, the diaphragm can be more sensitivity to the acoustic signal, for example. Several embodiments are provided for description of the invention. The present invention is not just limited to the embodiments. Further, for the provided embodiments, the embodiments can be properly combined to each other without limiting to an individual embodiment itself.

Figure 2A:
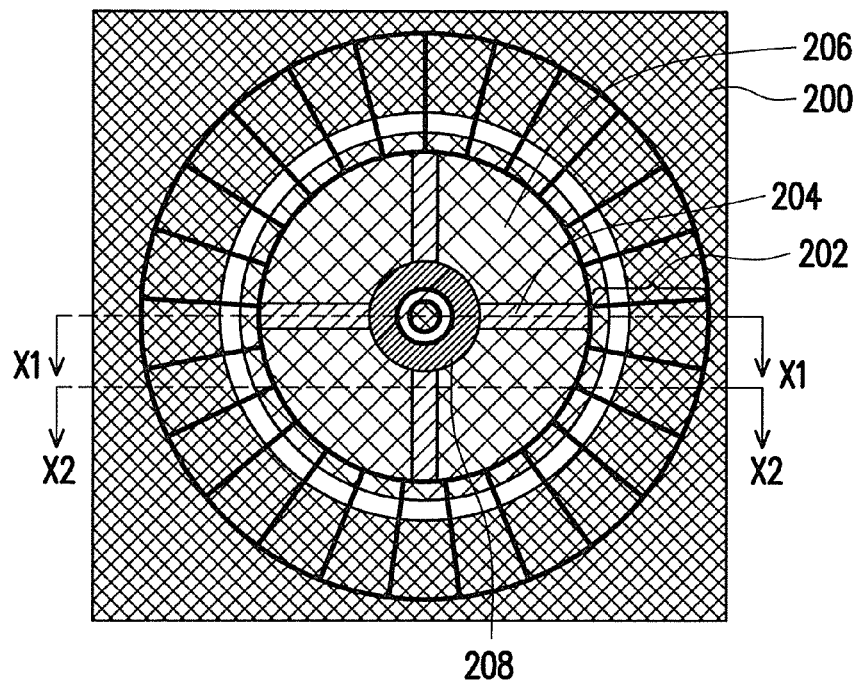
FIG. 2A is a top view, schematically illustrating a MEMS device, according to an embodiment of the present invention.
Figure 2B:
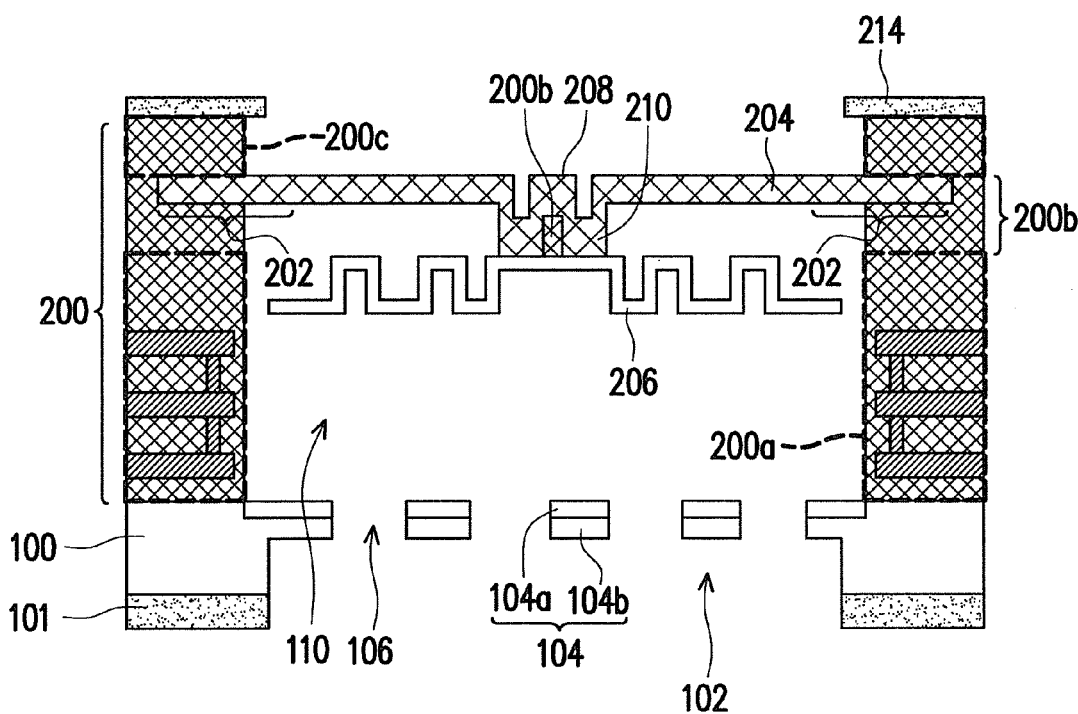
FIGS. 2B and 2C are cross-sectional views, schematically illustrating the MEMS device in FIG. 2A at cutting lines X1 and X2.
Figure 2C:
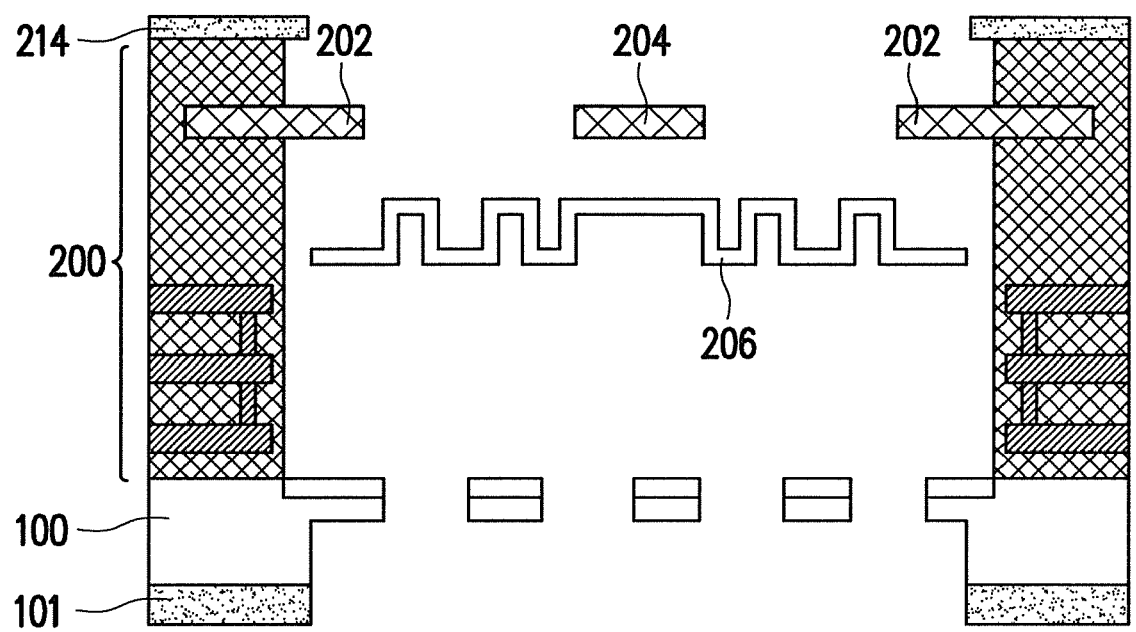

FIG. 2A is a top view, schematically illustrating a MEMS device, according to an embodiment of the present invention. FIGS. 2B and 2C are cross-sectional views, schematically illustrating the MEMS device in FIG. 2A at cutting lines X1 and X2.

Figure 1:
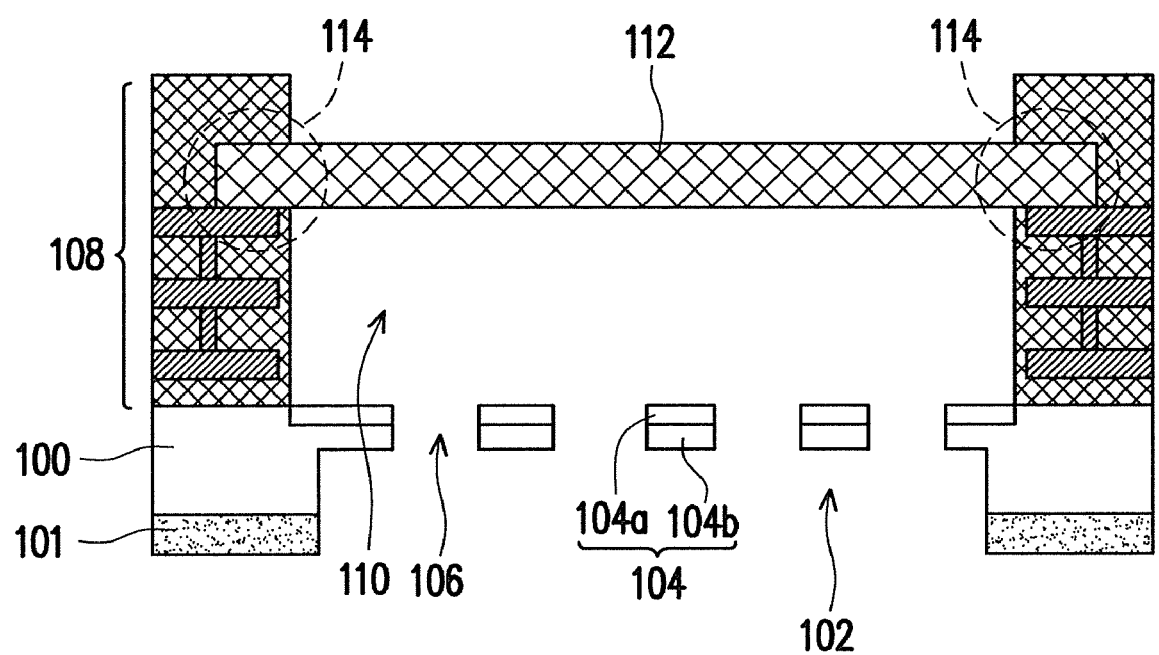
FIG. 1 is a cross-sectional view, schematically illustrating a conventional structure of MEMS microphone.

Referring to FIG. 2A and FIGS. 2B-2C, the element of substrate 100, the cavity 102, the venting hole 106 and the chamber 110 are the same as in FIG. 1, and no further descriptions on these elements. However, the structural dielectric layer 200 in the present invention is proposed. Here, the chamber in top view is a circular region, for example. A suspension layer 204 is clamped by the structural dielectric layer 200 at the end portion 202 as an end ring.

The structural dielectric layer 200, for example, includes three parts of dielectric layers 200a, 200b and 200c. The dielectric layer 200a is the main part, including the conductive structure, serving as the interconnection to the external circuit. The second dielectric layer 200b is for adapting the suspension layer 204. The dielectric layer 200c is on top of the suspension layer 204. The etching mask layer 214 is formed on the dielectric layer 200c for use to remove at least a portion of dielectric layer on the suspension and diaphragm. As a result, the suspension layer 204 is inserted into the structural dielectric layer 200 at the fixed position. The suspension layer 204 can have, for example, the joint structure 208, which is a protruding portion 210 in corrugated structure. A residual dielectric of the dielectric layer 200b may be included, depending on fabrication process. The joint structure 208 can be used to hold the diaphragm 206 at a proper position, such as the center region. The suspension layer 204 includes for example several arms from the end 202 to the joint structure 208. FIG. 2A shows the more clear structure of the suspension layer 204 in four arms, for example.

The diaphragm 206 is fixed to the joint structure 208 of the suspension layer 204 at the central region. As a result, the other portion of the diaphragm is free in vibration for sensing the acoustic signal, for example. The diaphragm 206 can be, for example, corrugated. The diaphragm 206 can also be, for example, a disk shape in this embodiment. However, other geometric shape is also suitable, such as the regular polygon. In this example, a corrugated disk is taken as one example for description.

In FIG. 2B, since the cutting line is at X1, it can be seen that the suspension layer 204 inserted into the structural dielectric layer 200. In FIG. 2C, it is the structure at the cutting line X2. In this situation, the arm and the end portion 202 of the suspension layer 204 are seen.

In general, the suspension layer 204 is coupled to the diaphragm 206, for example, at the central region, so that the diaphragm 206 can be relatively much free in motion for sensing the pressure of the acoustic signal.

Figure 3A:
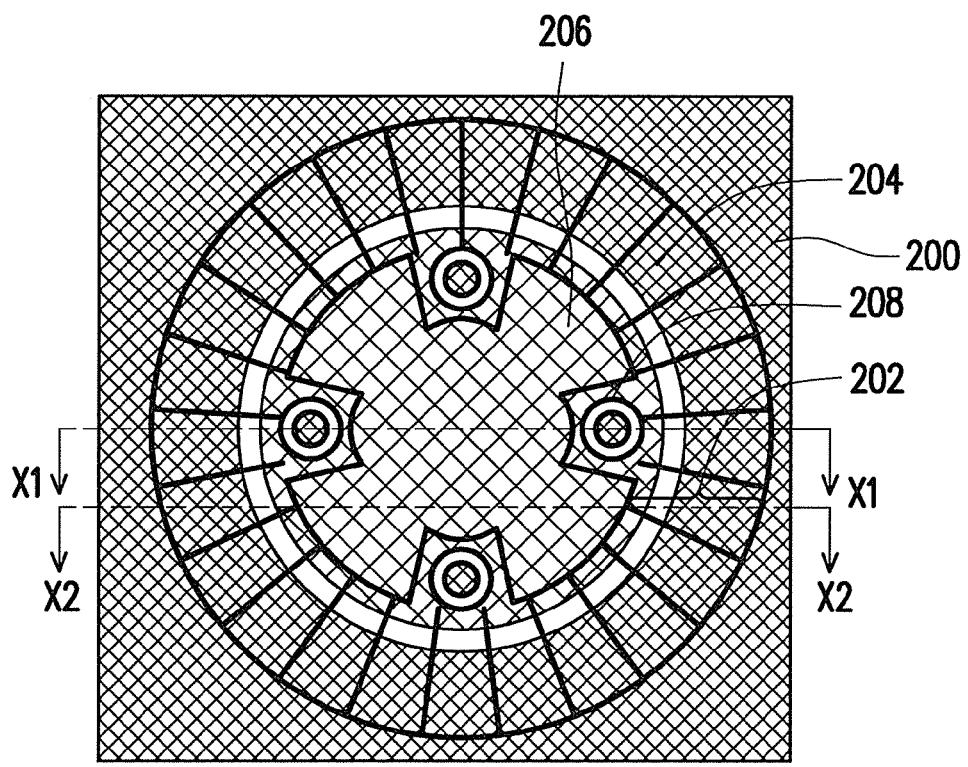
FIG. 3A is a top view, schematically illustrating a MEMS device, according to an embodiment of the present invention.
Figure 3B:
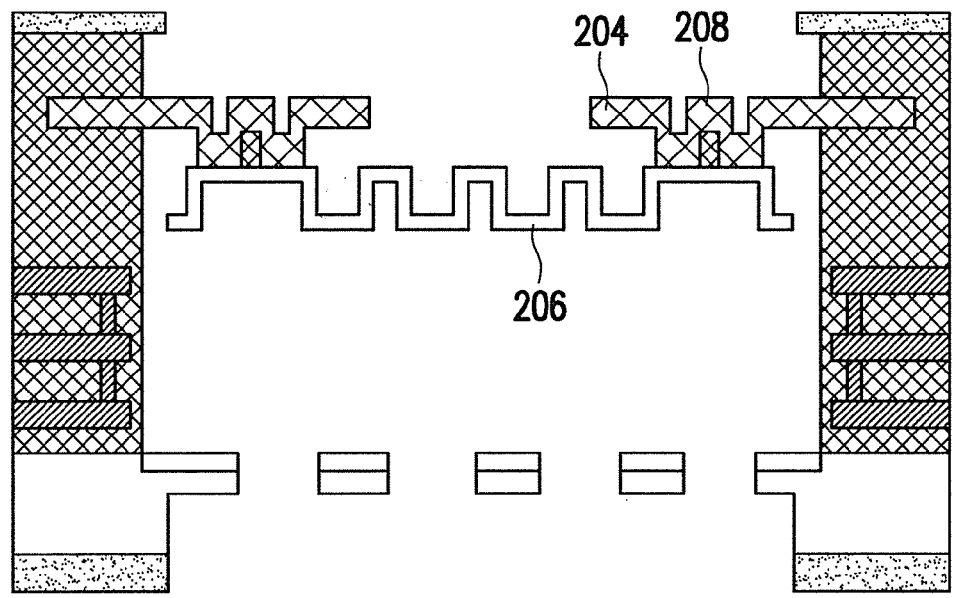
FIGS. 3B-3C are cross-sectional views, schematically illustrating the MEMS device in FIG. 3A at cutting lines X1 and X2.
Figure 3C:
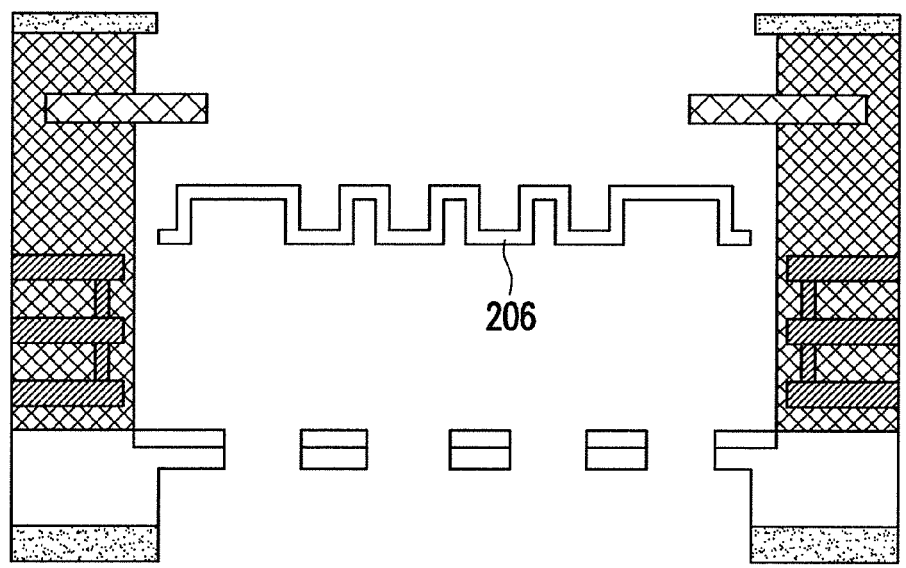

Based on the same principle, several other options can be taken. FIG. 3A is a top view, schematically illustrating a MEMS device, according to an embodiment of the present invention. FIGS. 3B and 3C are cross-sectional views, schematically illustrating the MEMS device in FIG. 3A at cutting lines X1 and X2. In FIG. 3A, the suspension layer 204 may have several joint structures 208 evenly distributed at the ring of the end portion 202. In FIG. 3A and FIG. 3B, the diaphragm 206 is the same as in FIG. 2A. However, the suspension layer 204 has, for example, four joint structures 208 in symmetric positions to hold the diaphragm 206 at four local positions. In this situation, the diaphragm 206 is locally fixed to the suspension layer 204 and can still have sensitivity to sense the acoustic signal. In FIG. 3C, the suspension layer 204 is seen at the end portion 202.

Figure 4:
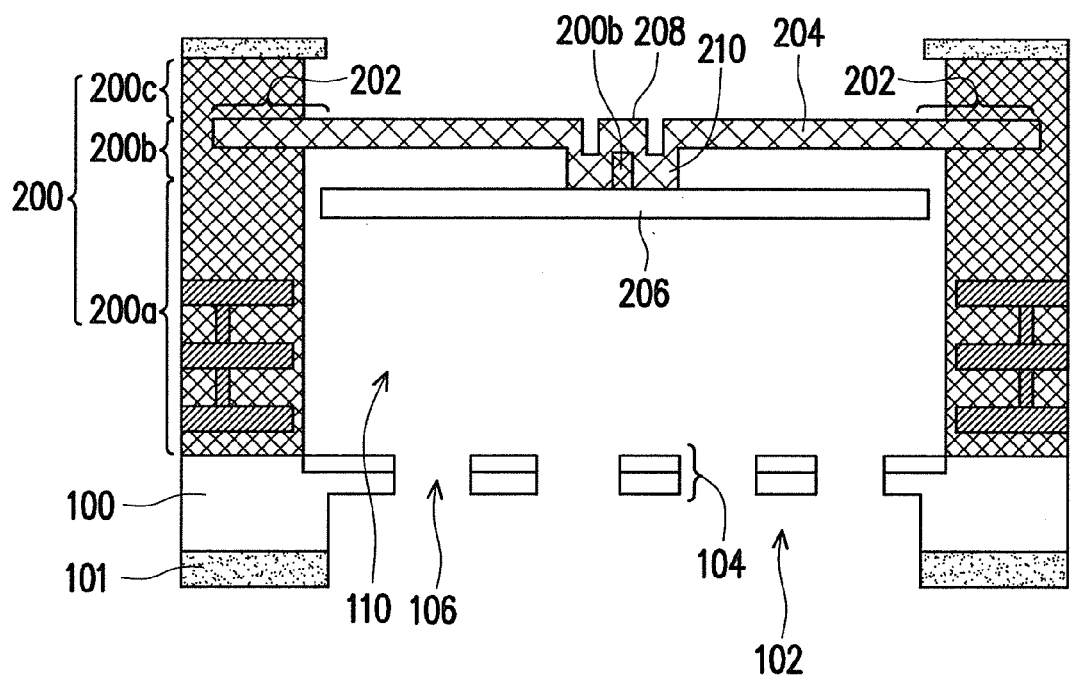
FIGS. 4-6 are cross-sectional views, schematically illustrating MEMS devices, according to embodiments of the present invention.
Figure 5:
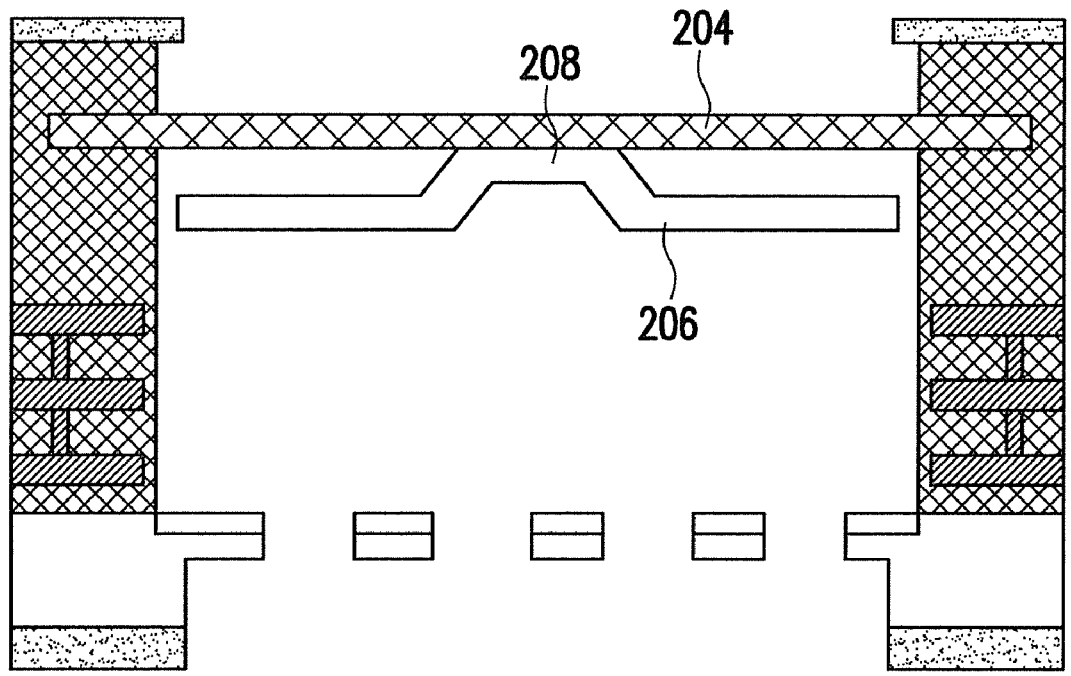
Figure 6:
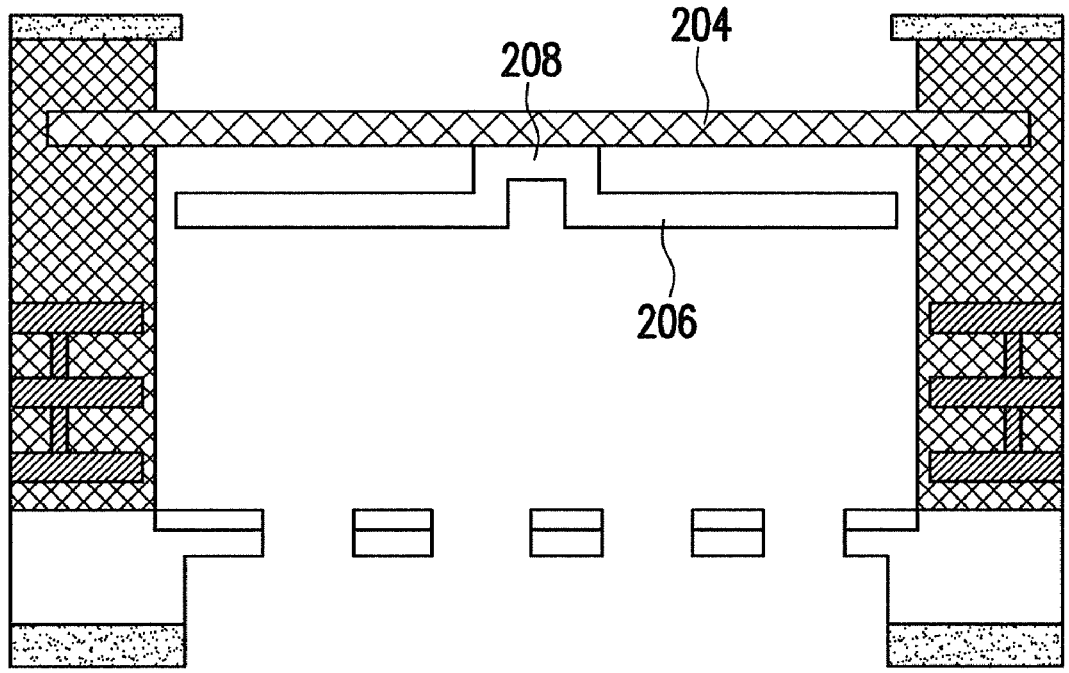

FIGS. 4-6 are cross-sectional views, schematically illustrating MEMS devices, according to embodiments of the present invention. In FIG. 4, for the further options, the diaphragm is, for example, a disk but not being corrugated. In FIG. 5, alternatively, the suspension layer 204 can be flat and the diaphragm 206 has the protruding joint portion 208 in this example, so that the diaphragm 206 is locally fixed to the suspension without being clamped into the structural dielectric layer 200. In FIG. 6, it is basically similar to the structure in FIG. 5. This difference is that the joint portion 208 of the diaphragm 206 is fixed to the suspension layer 204 by a more perpendicular shape.

Figure 7:
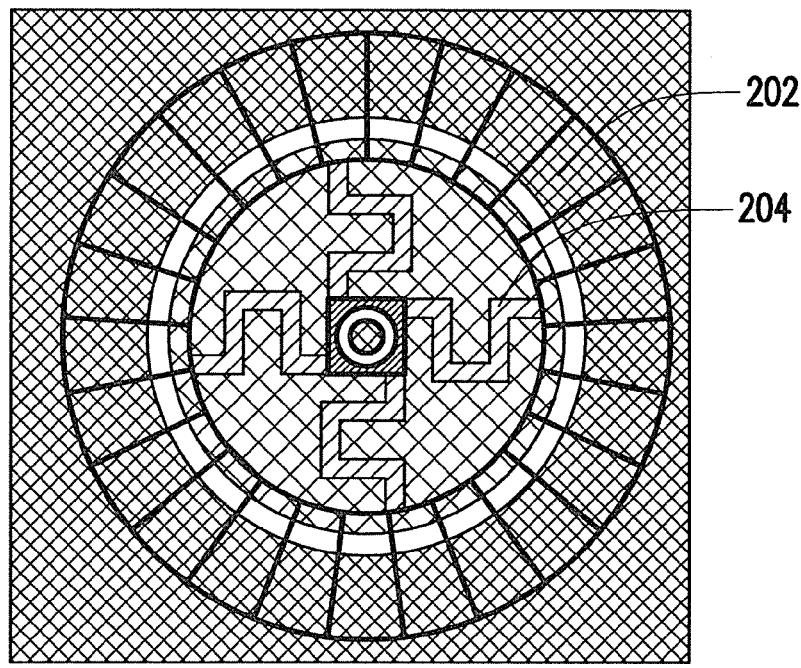
FIGS. 7-9 are top views, schematically illustrating MEMS devices, according to embodiments of the present invention.
Figure 8:
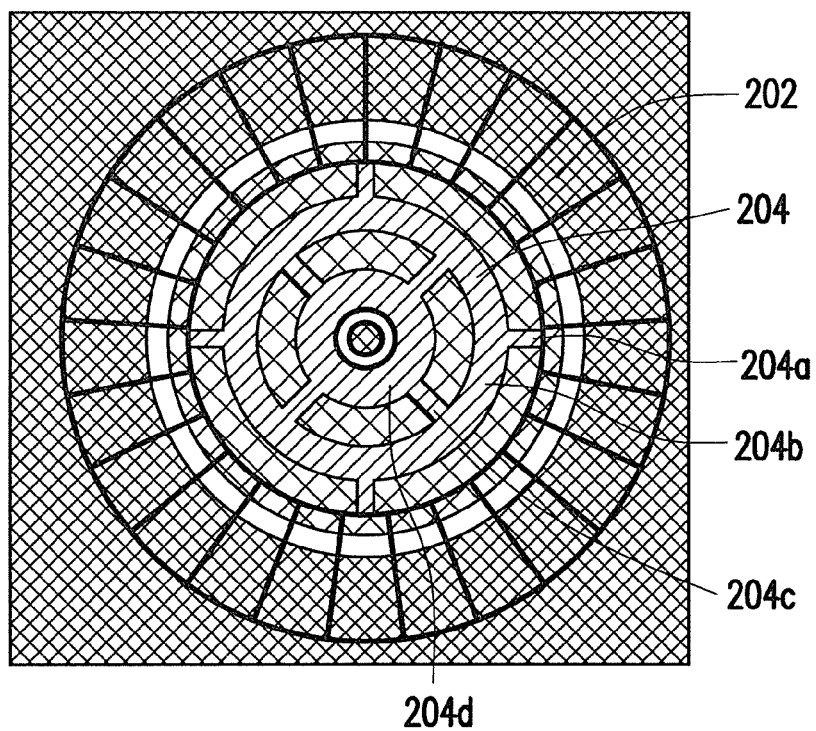
Figure 9:
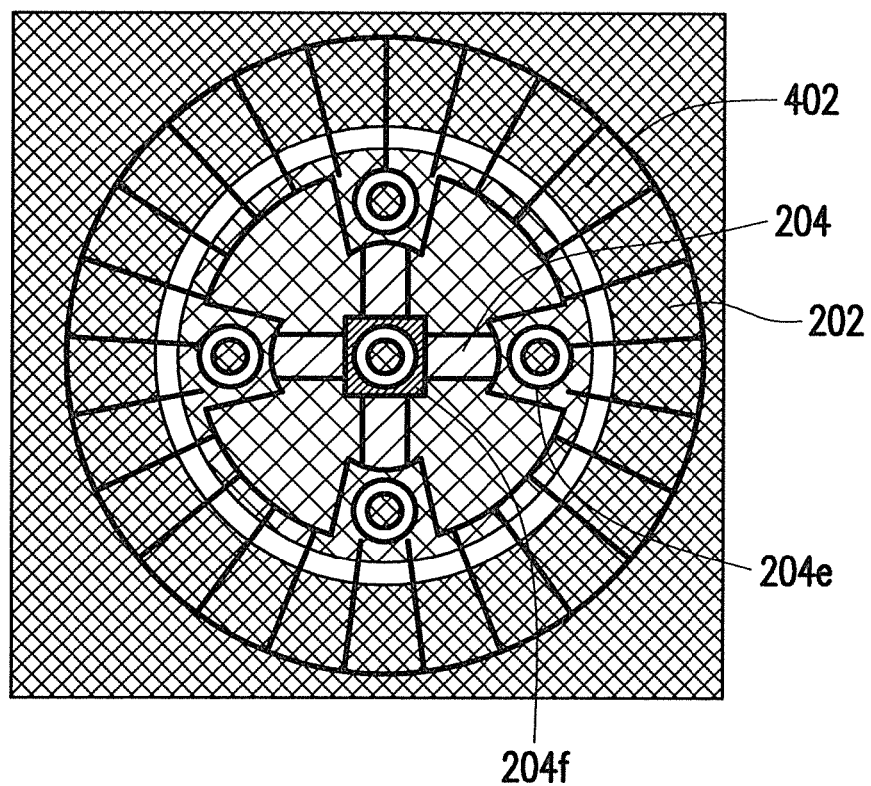

FIGS. 7-9 are top views, schematically illustrating MEMS devices, according to embodiments of the present invention. In FIG. 7, alternatively, the arms of the suspension 204 can be also corrugated in horizontal plane, for example. In FIG. 8, the arms of the suspension 204 can also be, for example, formed by the outer arms 204a, inner ring 204b, inner arms 204c and the joint structure 204d. In FIG. 9, the suspension layer 204 includes the joint structure 204e, extended from the ring portion 202, and the central joint structure 204f. The location and number of the joint structures can be properly adjusted. In addition, the number of the arms is not limited to four. It is better to distribute the arms evenly to have the uniform sensitivity. However, it is the design choices. If the sensitivity is intended to have a specific choice, the position and number of the arms can be properly adjusted.

Figure 10:
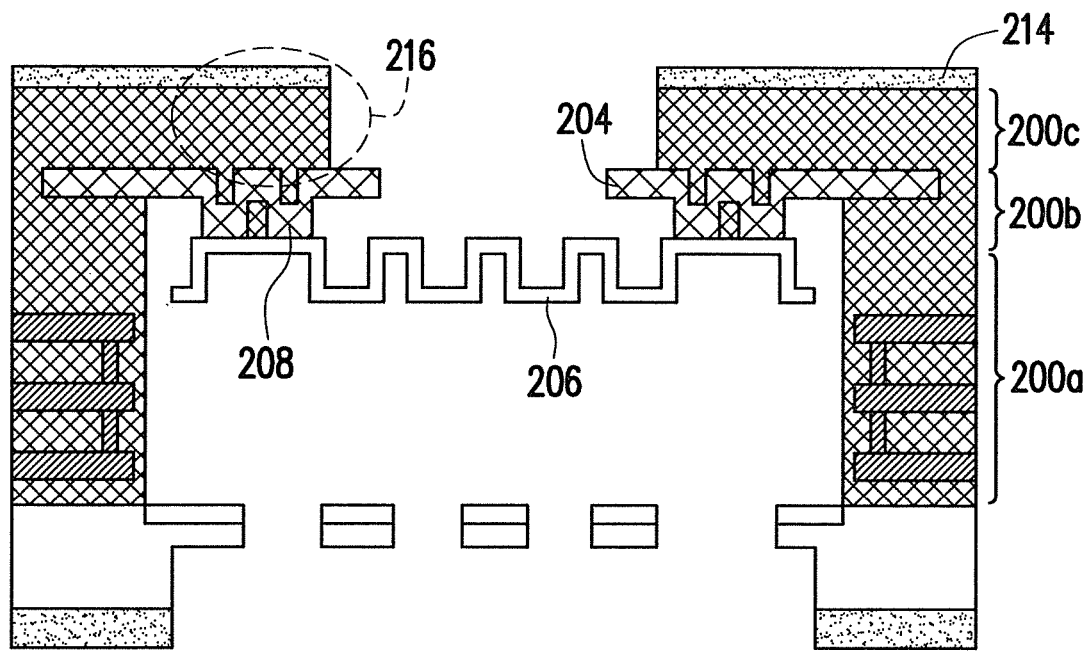
FIGS. 10-22 are cross-sectional views or top views, schematically illustrating the MEMS structure in various options, according to an embodiment of the present invention.

FIGS. 10-22 are cross-sectional views or top views, schematically illustrating the MEMS structure in various options, according to an embodiment of the present invention. In FIG. 10, comparing with FIG. 3B, the suspension layer 204 can also include a portion of the dielectric layer 200c and the etching stop layer 214 by adjusting the covering area of the etching stop layer 214 in fabrication process. The suspension layer 204 at the location 216 can be more stiff and strong to hold the diaphragm structure.

Figure 11:
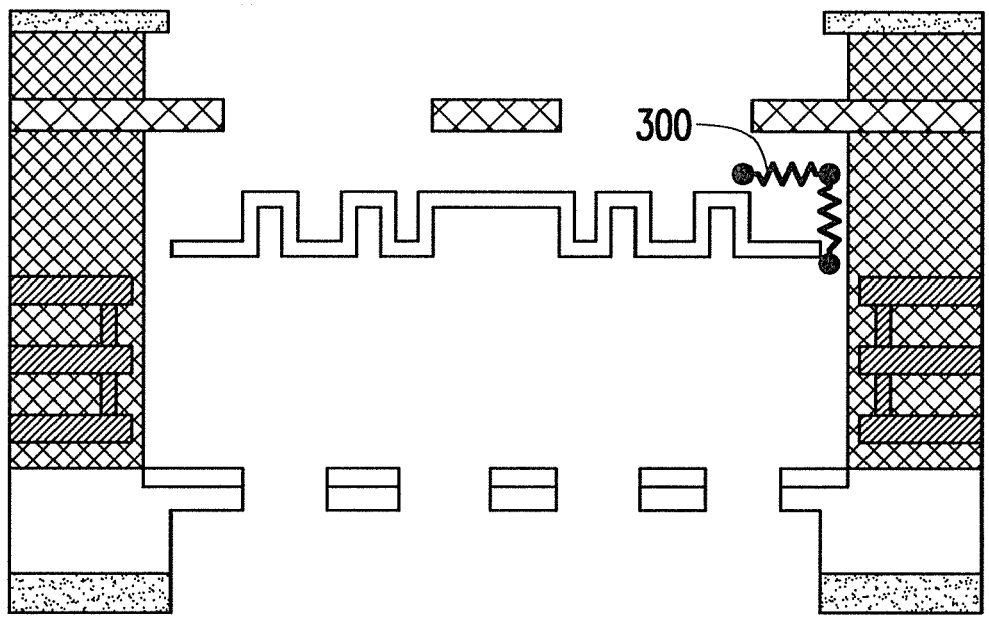

In FIG. 11, a usual issue is considered. The low frequency roll point of the microphone is very dependent on the acoustic resistance of the pressure equalization path 300. In order to maintain the performance of the low frequency operation, the higher acoustic resistance is required.

Figure 12:
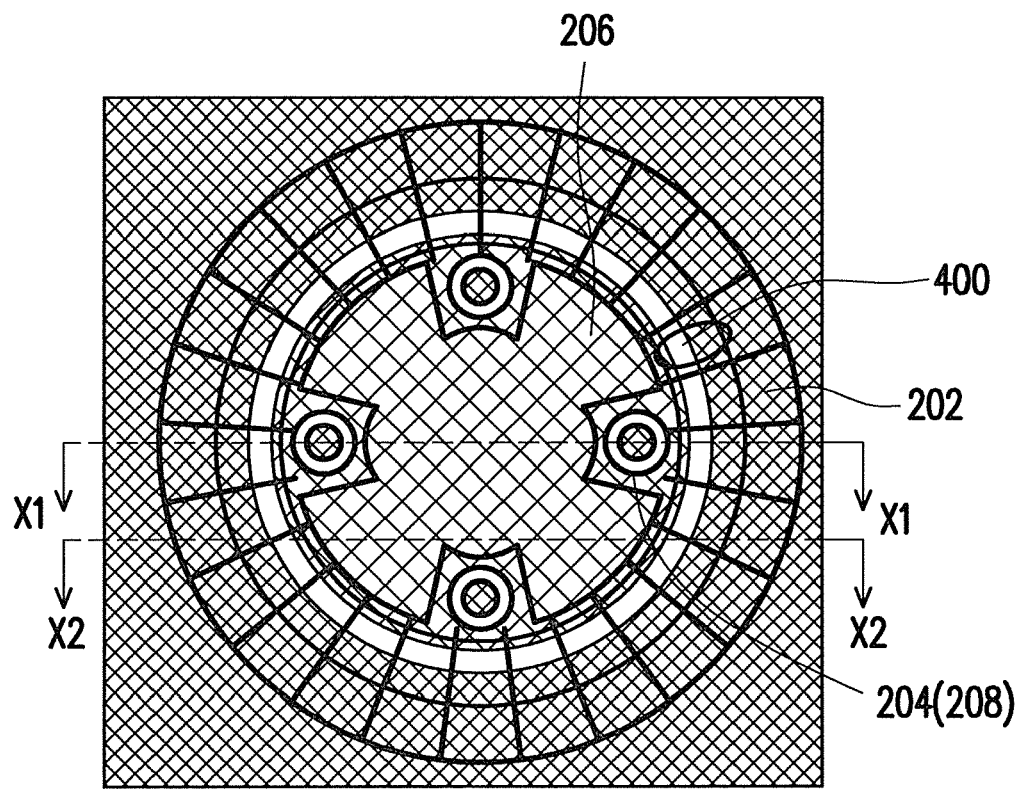
Figure 17:
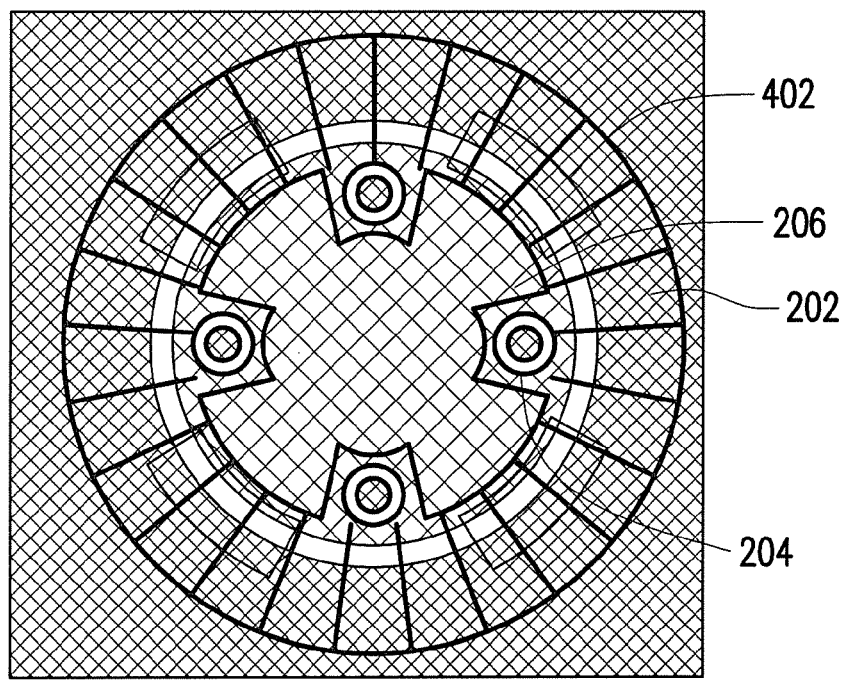

A metal sealing ring 400 in FIG. 12 or a metal bumper 402 in FIG. 17 under the diaphragm 206 can be taken, for example, so that the acoustic resistance can be improved. In FIG. 12, the metal ring 400 is taken as the example and can increase the acoustic resistance existing around the edge of the free diaphragm. That will improve the low frequency roll off point of MEMS application like microphone.

Figure 13:
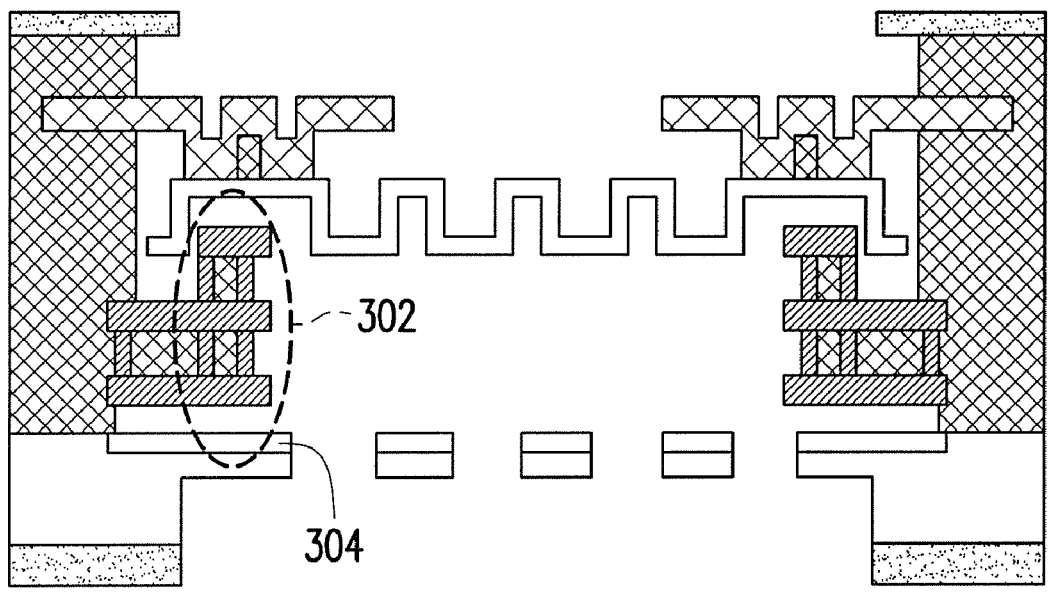
Figure 14:
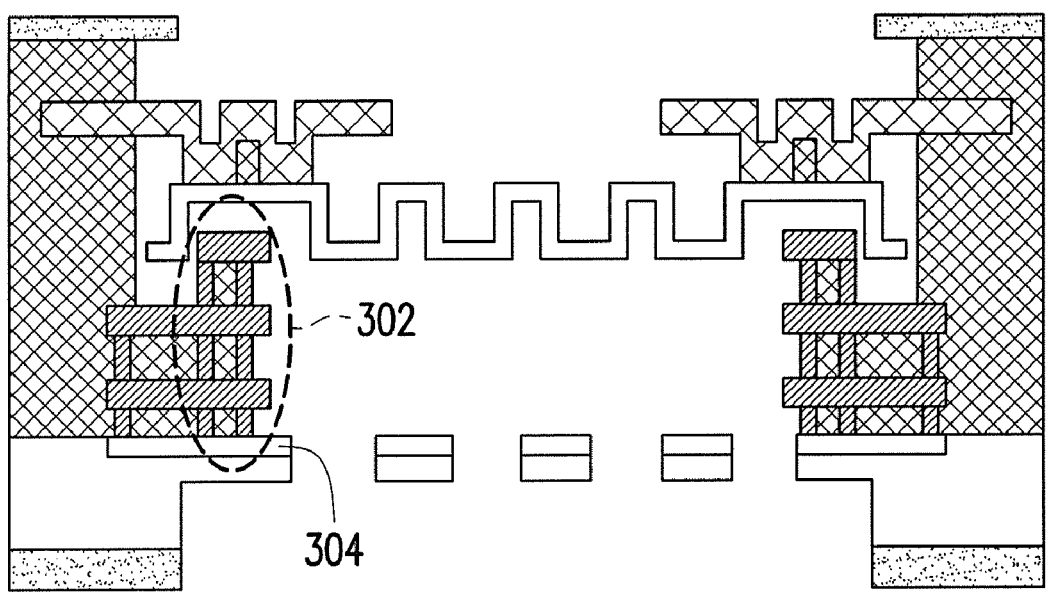
Figure 15:
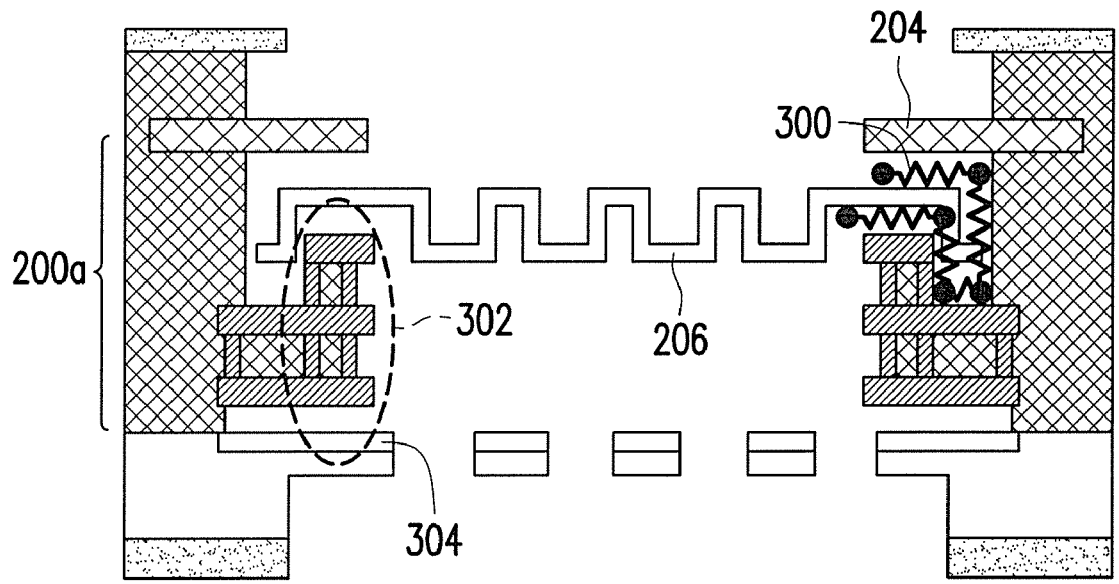
Figure 16:
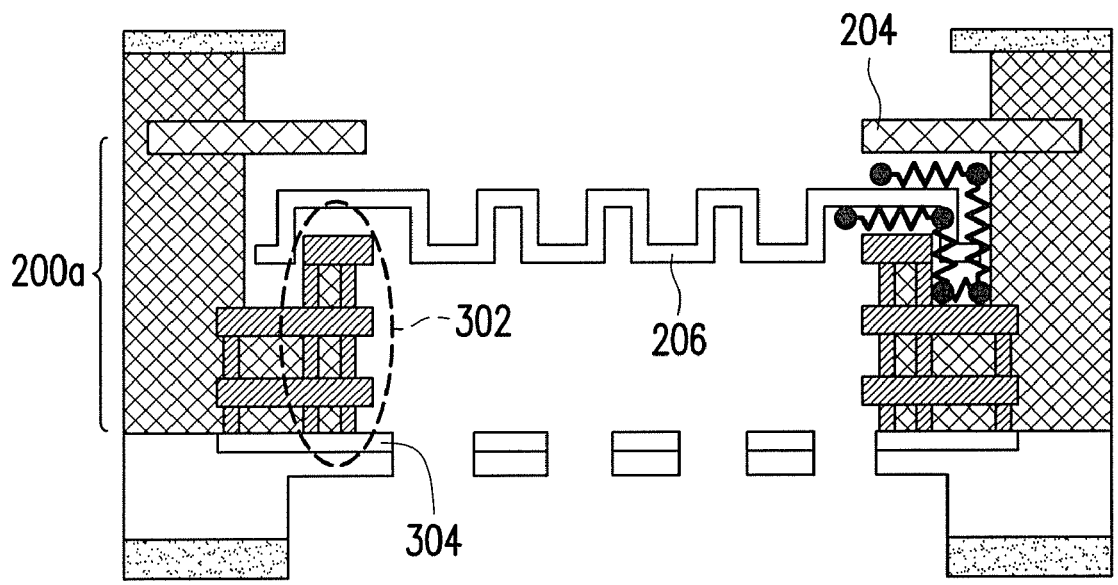

In FIG. 13, it is the cross-sectional view in FIG. 12 at the cutting line X1. The metal ring 400 can be a part of the conductive structure in the structural dielectric layer but a portion of the conductive structure is exposed as the metal ring or conductive ring, serving as a sealing ring 302. In this example, the sealing ring 302 is distant from the doped layer 304 of the substrate 100 by a gap. The back plate 306 has the venting holes, as previously described. Alternatively in FIG. 14, the gap between the sealing ring 302 and the doped layer 304 of the substrate 100 can be also filled by the dielectric layer and conductive layer, and the sealing ring structure is coupled to the substrate. The suspension layer and the diaphragm can remain the same. In FIG. 15 and FIG. 16, the cross-sectional structures are at the cutting line X2 of FIG. 12. The acoustic resistance 300 can be created due to the path between the diaphragm and the sealing ring 302. In FIG. 16, the structure is based on FIG. 14 and the acoustic resistance can still remain.

In FIG. 17, under the same mechanism, the sealing ring can be changed as the metal bumper 402 without forming as the ring. In other words, the sealing ring is broken into several bumpers. The effect of acoustic resistance can still be improved.

Figure 18:
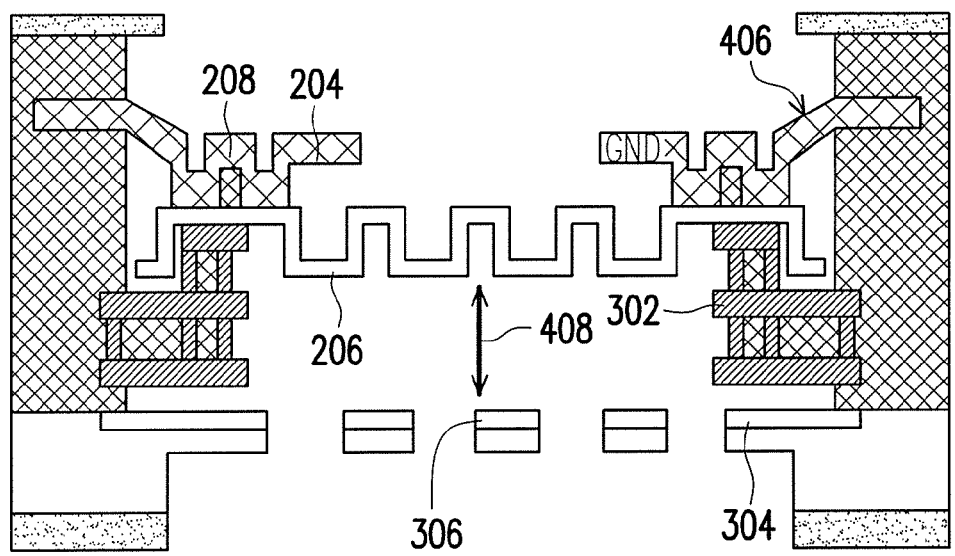
Figure 19:
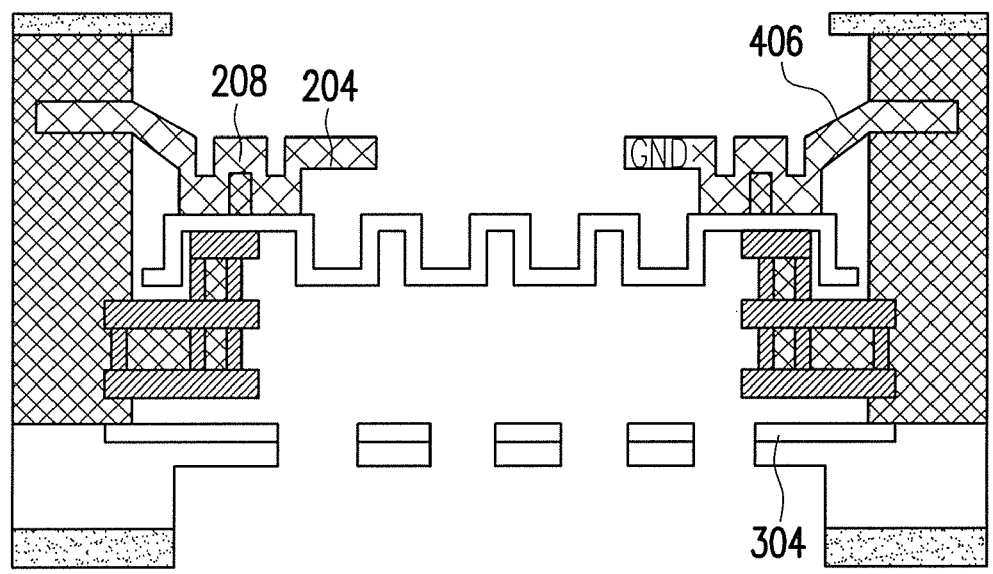
Figure 20:
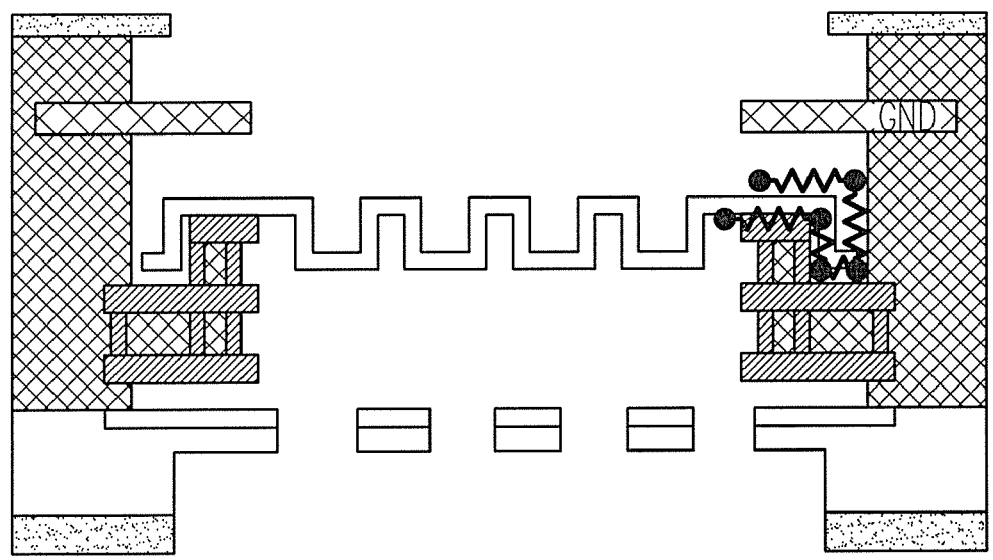

In FIG. 18, the acoustic resistance can be further increased in operation, based on the structure with the sealing ring 400 or bumpers 402. Due to the existence of the sealing ring 400 or bumpers 402. In operation, if it is intended, a bias voltage can be applied between the free diaphragm 206 and back plate 306. As a result, the ending portion 406 is caused and the free diaphragm 206 is then moved toward to back plate 306 by electrostatic force, and may contact to the metal sealing ring 400 or bumper 402. The metal sealing ring or bumper behave as a support structure, and optionally connect to Si Substrate or not as the choice. In FIG. 19, the mechanism is the same while the sealing ring is solidly connected to the substrate 304 by the dielectric layer. In FIG. 20, due to the cross-sectional view is at different cutting line without crossing the joint structure, the suspension layer is not connected the diaphragm at this view.

Figure 21:
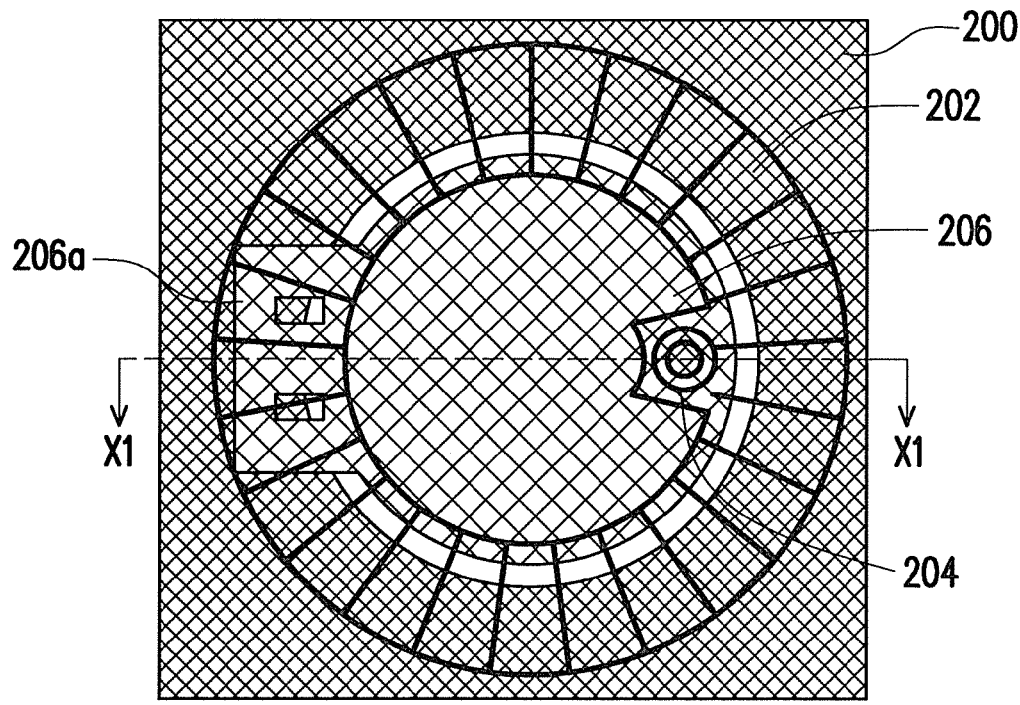
Figure 22:
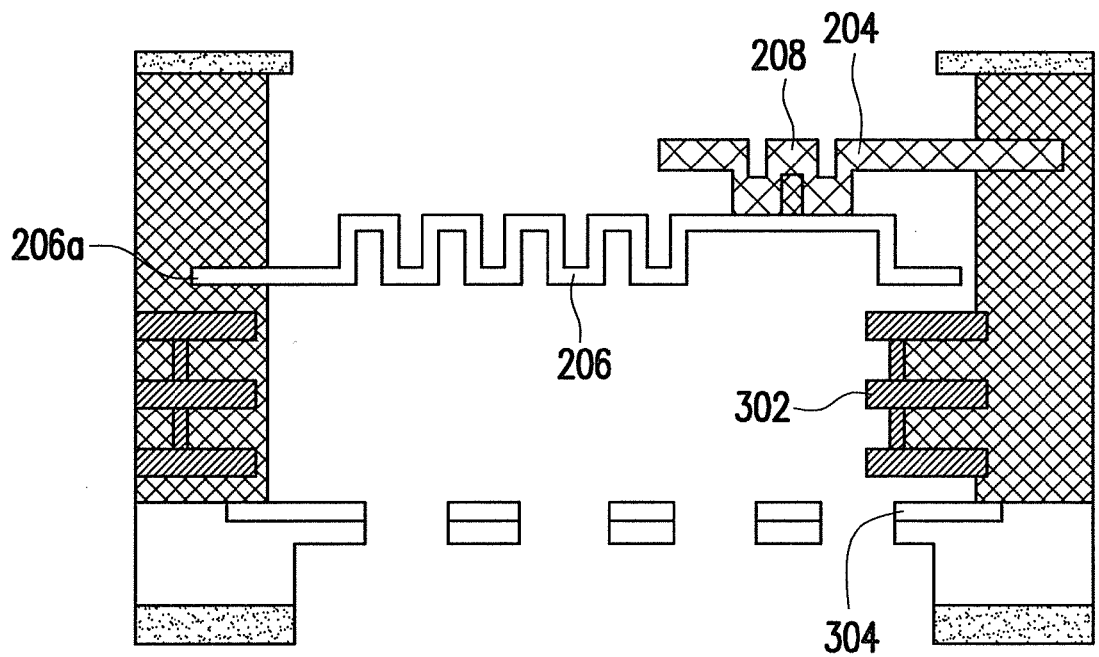

In FIG. 21 and/or FIG. 22, another structure can also be formed. As more clearly shown in FIG. 22 at the cutting line X1 in FIG. 21, in this embodiment, the joint structure 208 of the suspension layer 204 is, for example, just at one side portion while the diaphragm 206 has one side portion 206a being clamped into the structural dielectric layer. The diaphragm 206 can still remain relatively free for sensing the acoustic signal.

As previously mentioned, the present invention is not just limited to the provided embodiments and the embodiments between each other can be combined into more embodiments.

In following description, some fabrication processes are described to fabricate the MEMS device with the diaphragm and the suspension layer, for example. FIGS. 23A-30C are cross-sectional views, schematically illustrating fabricating processes, according to an embodiment of the present invention.

Figure 23A:
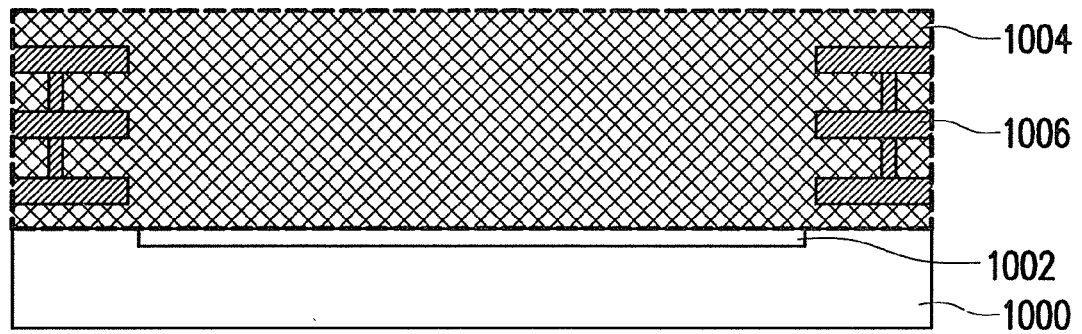
FIGS. 23A~30C are cross-sectional views, schematically illustrating fabricating processes, according to an embodiment of the present invention.
Figure 23B:
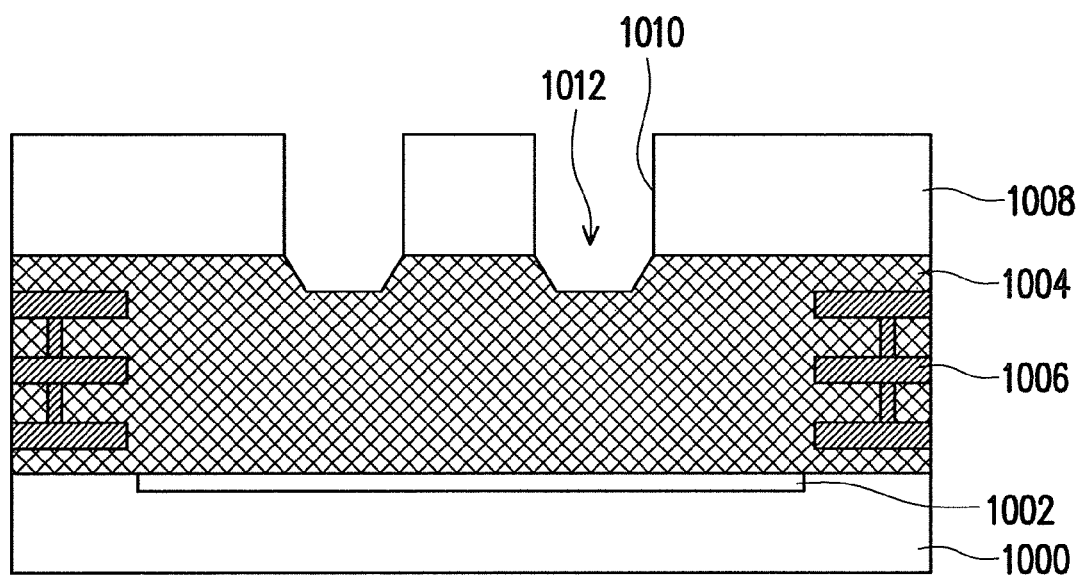

In FIG. 23A, a doped layer 1002 is formed in a silicon substrate 1000. a first structural dielectric layer, having a conductive structure 1006 embedded in the dielectric layer 1004, is formed on the substrate 1000. In FIG. 23B, a photoresist layer 1008 is formed on the dielectric 1004 with openings 1010 to expose the dielectric layer 1004. The photoresist layer 1008 is used as the etching mask, and an etching process is performed to form the indent regions 1012 or indent trenches.

Figure 23C:
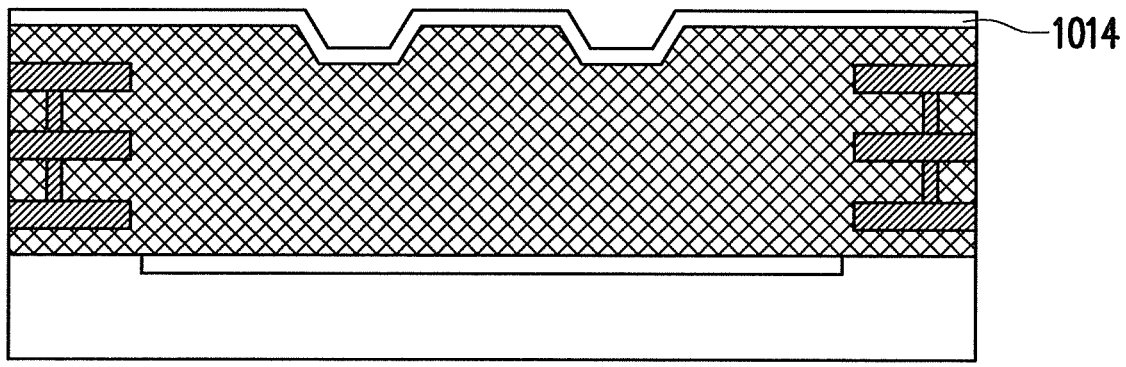
Figure 23D:
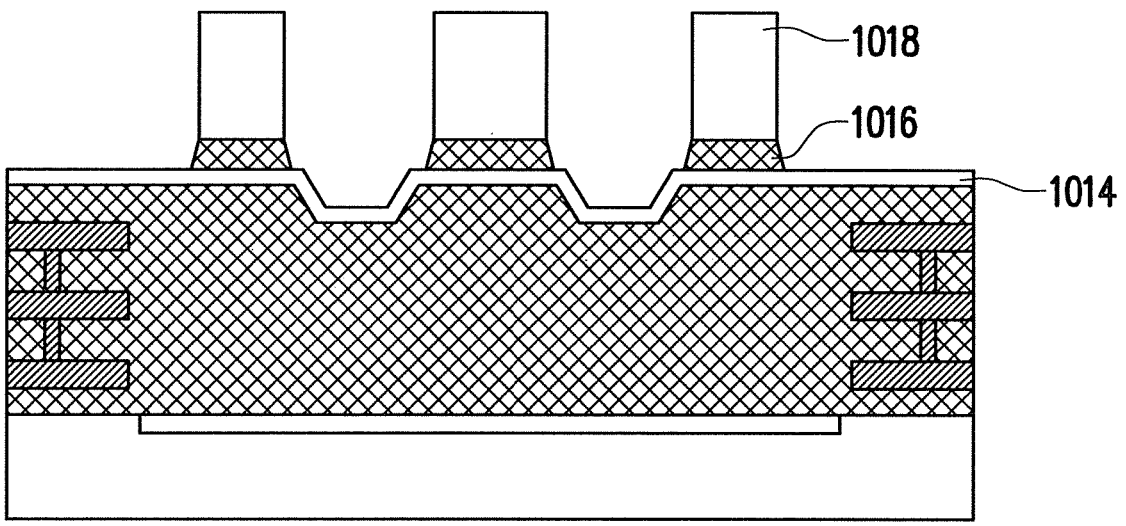

In FIG. 23C, after removing the photoresist layer 1008, a conductive layer 1014, such as the metal layer 1014, is formed over the dielectric layer 1004 in a conformal shape. In FIG. 23D, another dielectric layer is formed on the metal layer 1014 and patterned into the dielectric island 1016 adjacent to the indent trench by the photoresist layer 1018, or the dielectric island cover at least portion of indent region, or fully cover the indent region. Here, as can be understood, the trench and the island can be shape of circular, square or hexagon.

Figure 23E:
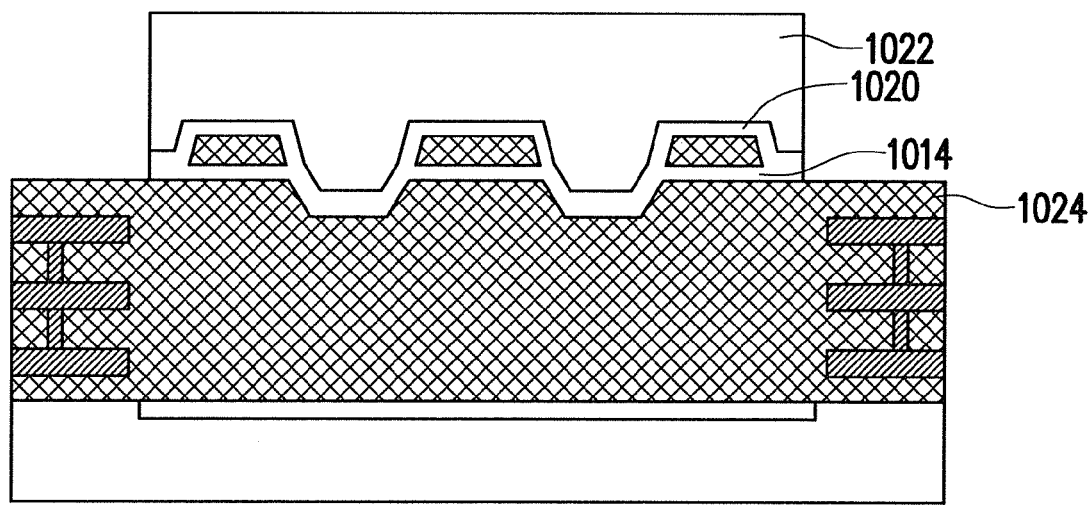

In FIG. 23E, another metal layer 1020 is formed over the metal layer 1014, so that the portion not on the dielectric island 1016 contact the metal layer 1014. As a result, the upper metal layer 1020 and the lower metal layer 1014 enclosed the dielectric islands 1016. A photoresist layer 1020 is formed on the metal layer 1020, and the exposed portion of the metal layers 1014 and 1020 is removed by etching. The metal layers 1014 and 1020 and the dielectric islands 1016 form the diaphragm later.

Figure 23F:
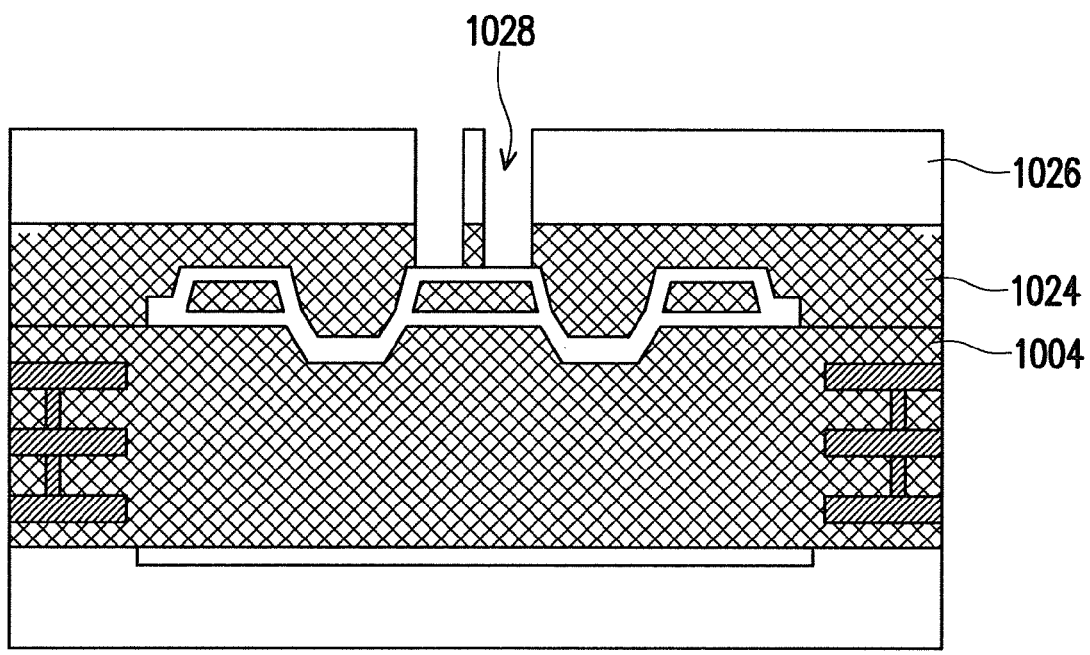

In FIG. 23F, after the photoresist layer 1020 is removed, another dielectric layer 1024 is formed over the substrate to cover the metal layer 1020 and the exposed portion of the dielectric layer 1004. Actually, the dielectric layer 1024 and the dielectric layer 1004 are formed together as a part of the structural dielectric layer of the MEMS device, such as the MEMS microphone. The dielectric layer 1024 is patterned by etching process with the photoresist pattern 1026 as the etching mask. The exposed portion of the dielectric layer 1024 is etched to form the openings 1028 for exposing the metal layer 1020.

Figure 23G:
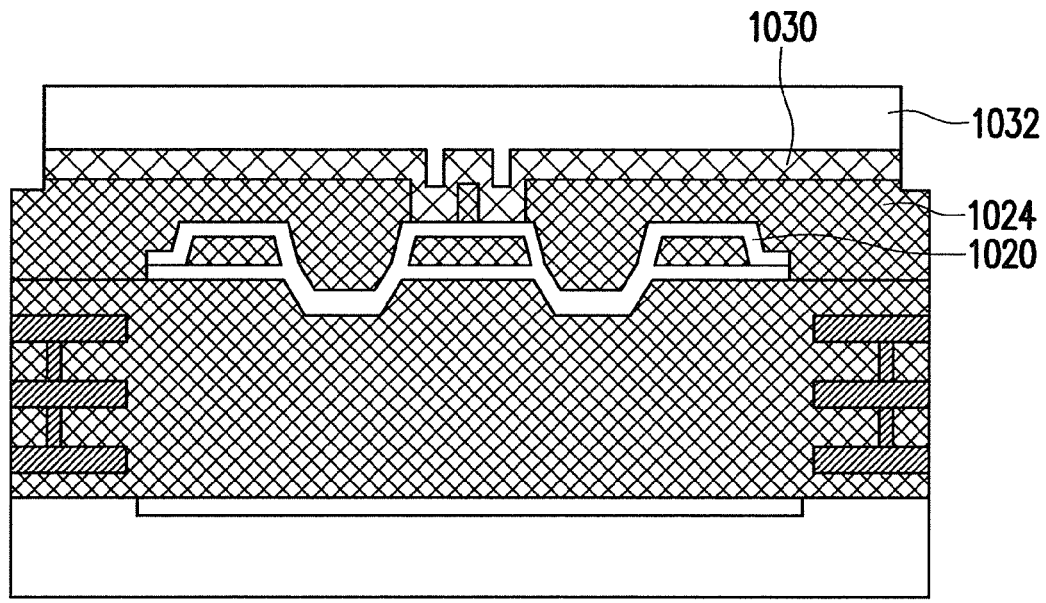
Figure 23H:
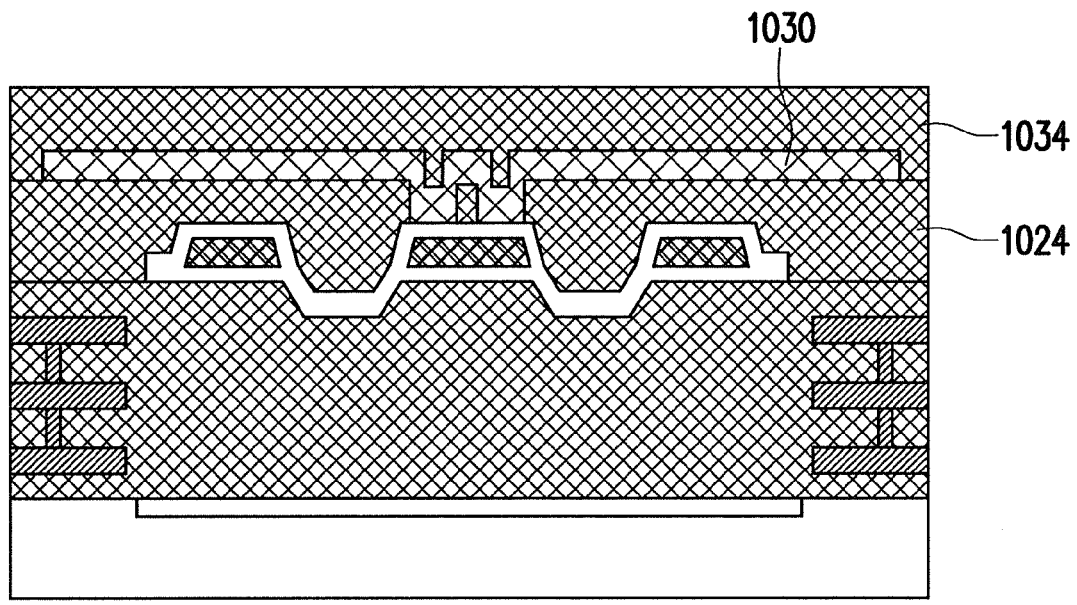

In FIG. 23G, after the photoresist layer 1026 is removed, a suspension layer 1030 is formed over the dielectric layer 1024, in which the opening 1028 is also filled with the suspension layer 1030. The suspension layer 1030 can be a conductive layer or composite thin film structure. A portion of the suspension layer 1030 is contact with a portion of the metal layer 1020 of the diaphragm, so that the diaphragm can be held by the suspension layer 1030 at the end structure. As for example described in FIG. 2A, the suspension has the joint structure and the arms. The structure of the suspension layer 1030 in contact with the diaphragm is the joint structure. An end portion of the suspension layer 1030 needed to be clamped into the structural dielectric layer. Therefore, the suspension layer 1030 is patterned by photolithographic process to form the photoresist pattern 1032 and is etched by anisotropic etching process to have the structure as for example shown in FIG. 2A at the cutting line X1. In FIG. 23H, another dielectric layer 1034, serving as the third part dielectric layer 200c of the structural dielectric layer 200 in FIG. 2A and FIG. 2B, is formed over the dielectric layer 1024.

Figure 23I:
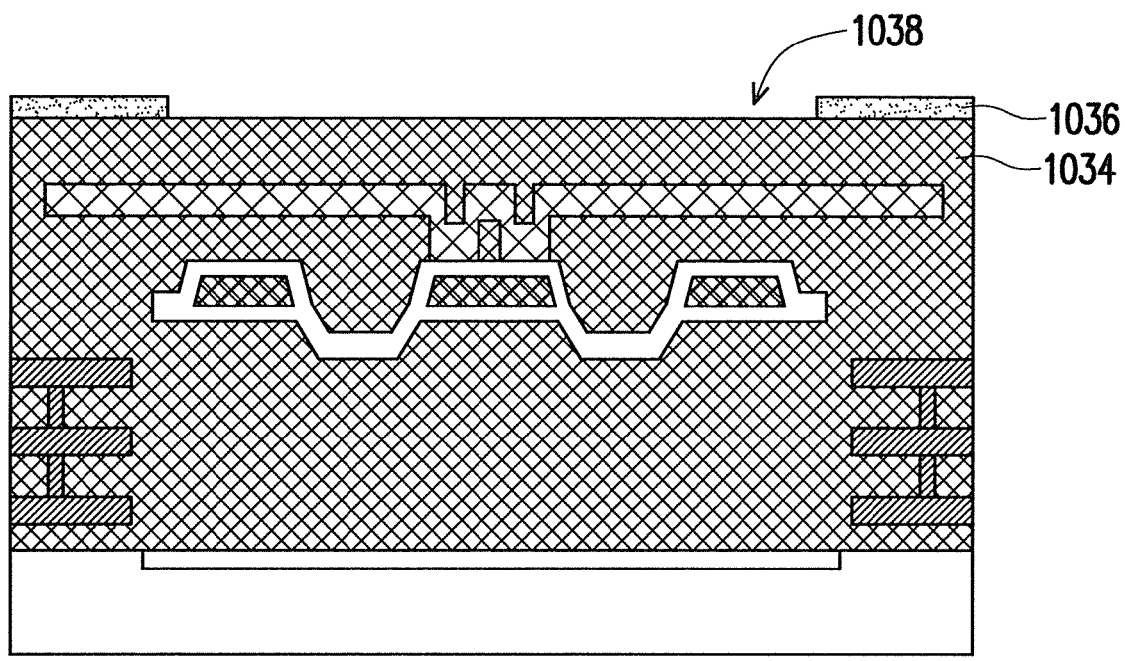
Figure 23J:
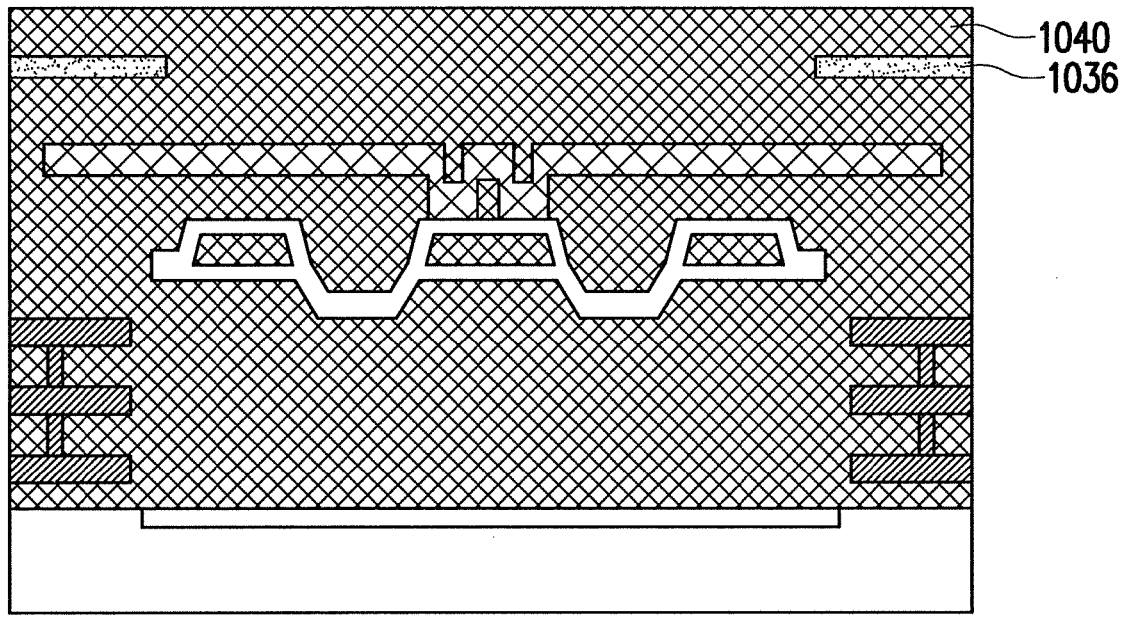

In FIG. 23I, an etching mask layer 1036 is formed over the dielectric layer 1034 with an opening 1038 to expose a portion of the dielectric layer 1034. In FIG. 23J, a protection dielectric layer 1040 can be optionally further formed over the etching stop layer and the dielectric layer 1034, so the process step in FIG. 23J can be skipped. The protection dielectric layer 1040 can, for example, protect the structure during the subsequent fabricating processes on the substrate. The protection dielectric layer 1040 can also provide a flat surface, which is for example helpful to carry the wafer for transferring robot or equipment from a working place to another working place during different fabricating processes.

Figure 23K:
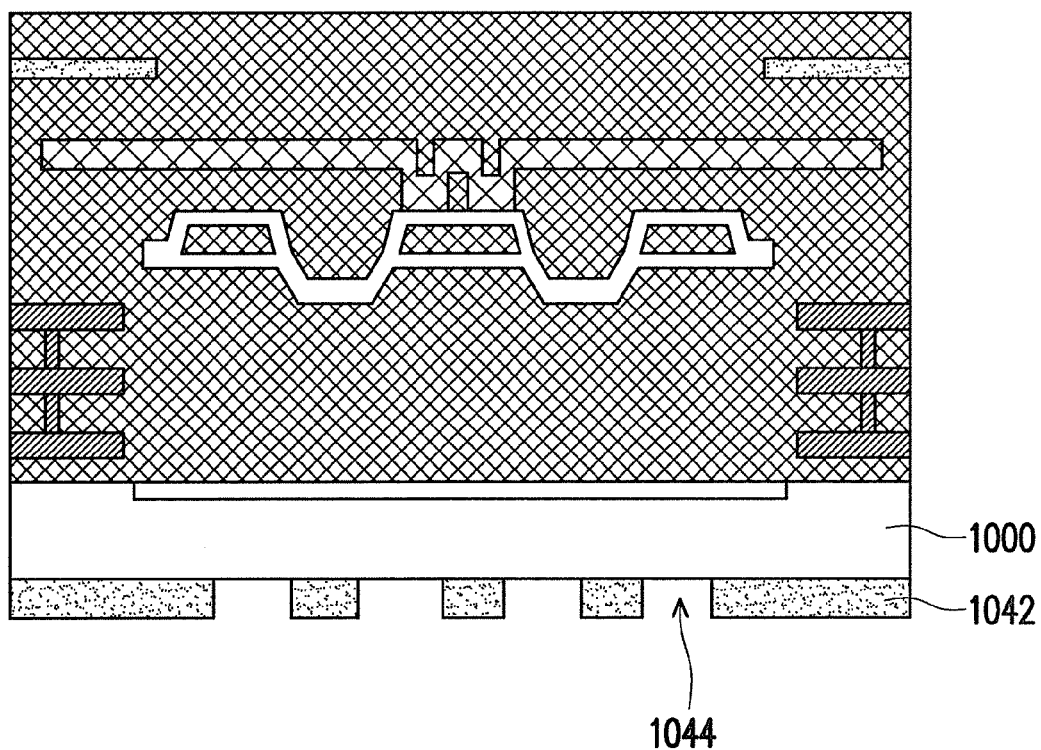
Figure 23L:
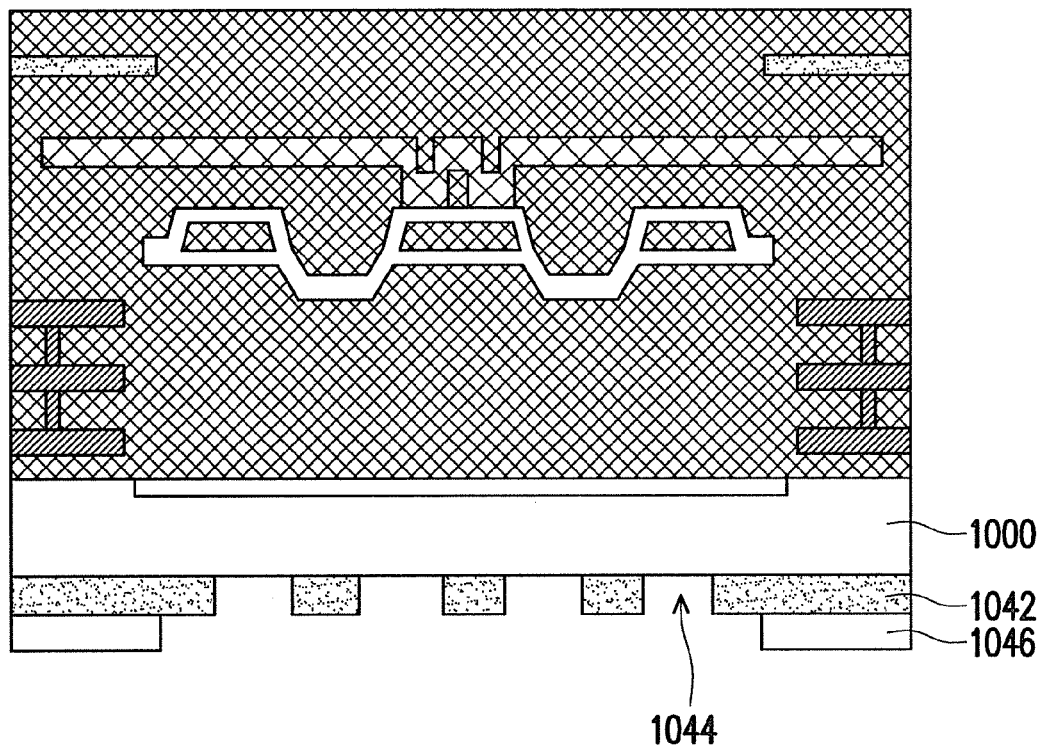

In FIG. 23K, a first etching mask layer 1042 is formed on the back side of the substrate 1000, in which several openings 1044 are in the first etching mask layer 1042 to expose the substrate 1000. The openings 1044 are corresponding to the venting holes to be formed later. In FIG. 23L, second etching mask layer 1046, such as photoresist layer or hard mask layer, is further formed on the first etching mask layer 1042 to expose a region, which is to be formed with a cavity later.

Figure 23M:
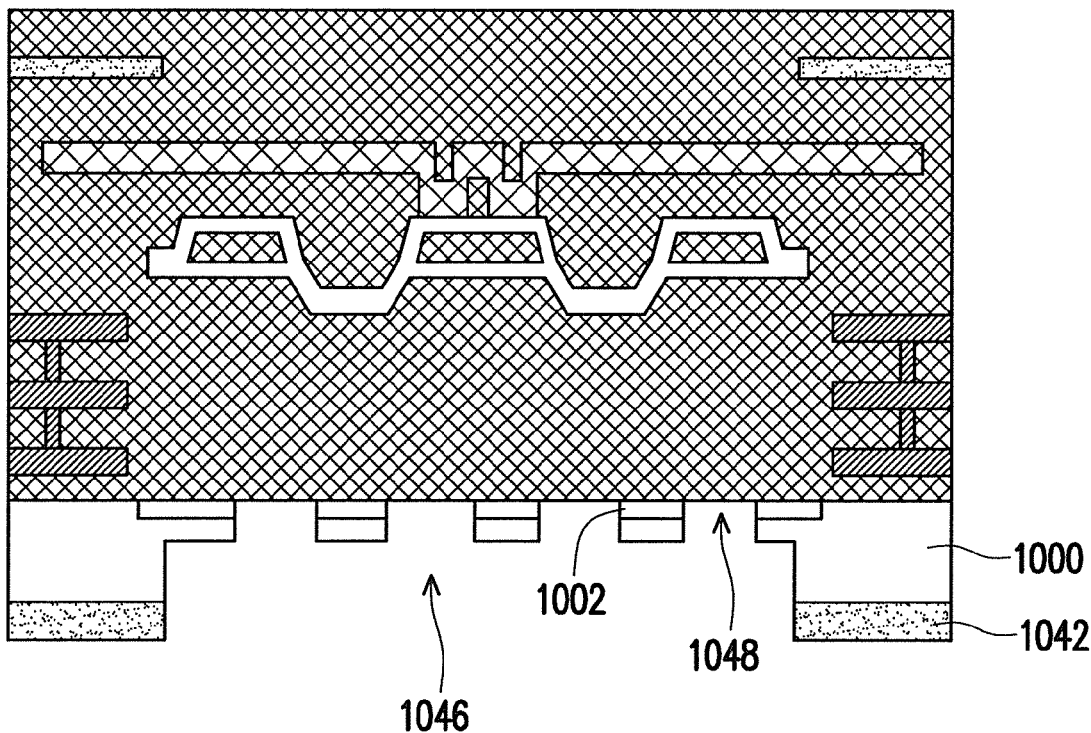
Figure 23N:
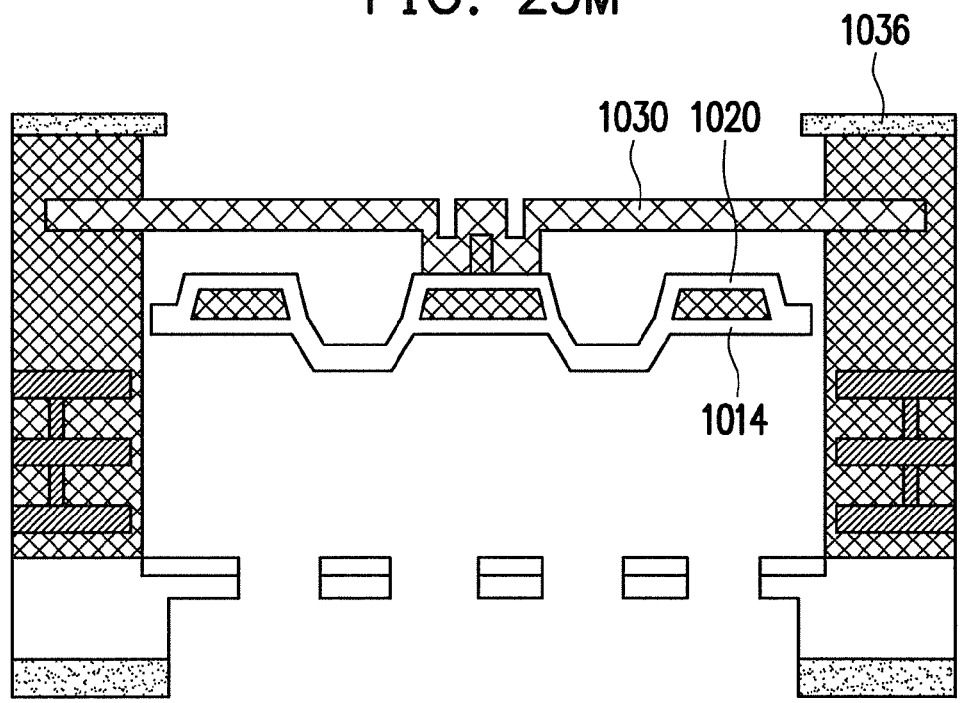

In FIG. 23M, due to the two steps of the etching mask layers 1042 and 1046, the anisotropic etching process can etch the substrate 1000 and the first etching mask layer 1042 into step structure by etching away the first etching mask in the middle of etching process, having the cavity 1046 in the substrate 1000 and the venting hole 1048 in the back plate within the cavity 1046, in which the doped layer 1002 within the cavity 1046 is also etched to expose the structure dielectric layer. In FIG. 23N, an isotropic etching process can be performed to remove portion of the dielectric layer of the first structure dielectric layers. As a result, the suspension layer 1030 and the metal layers 1020 and 1014 remains, in which the metal layers 1020 and 1014 form the corrugated diaphragm, held by the suspension layer 1030 at the central region. Here, the isotropic etching process can be performed from both sides to form the chamber and the cavity, in which venting holes allows the isotropic etching process to etch the dielectric from the backside of the substrate. The MEMS device is then accomplished. The first etch mask layer 1042 is optionally removed.

Figure 24A:
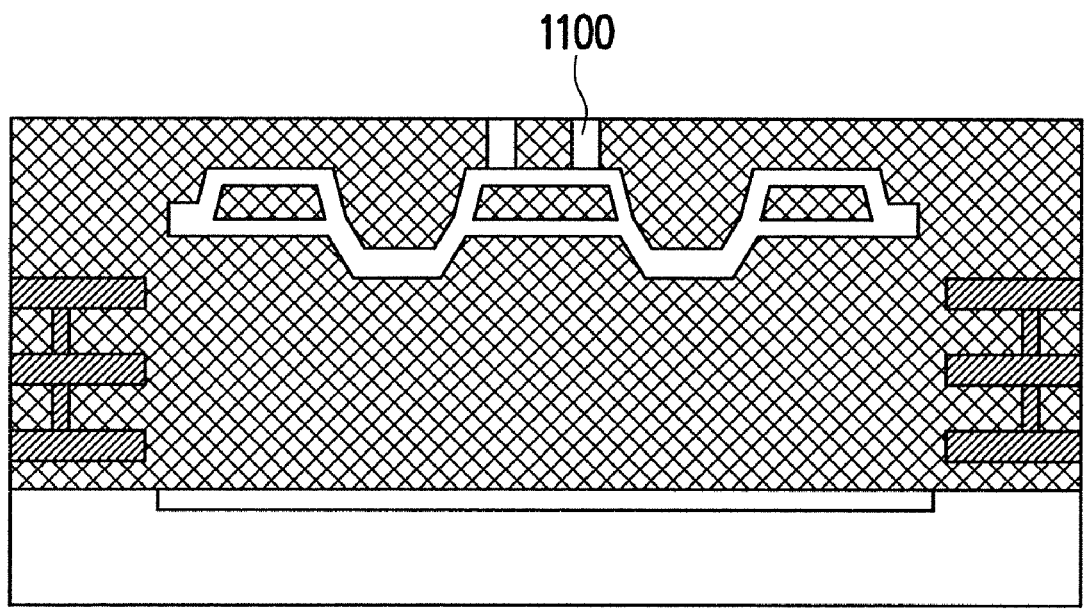
Figure 24B:
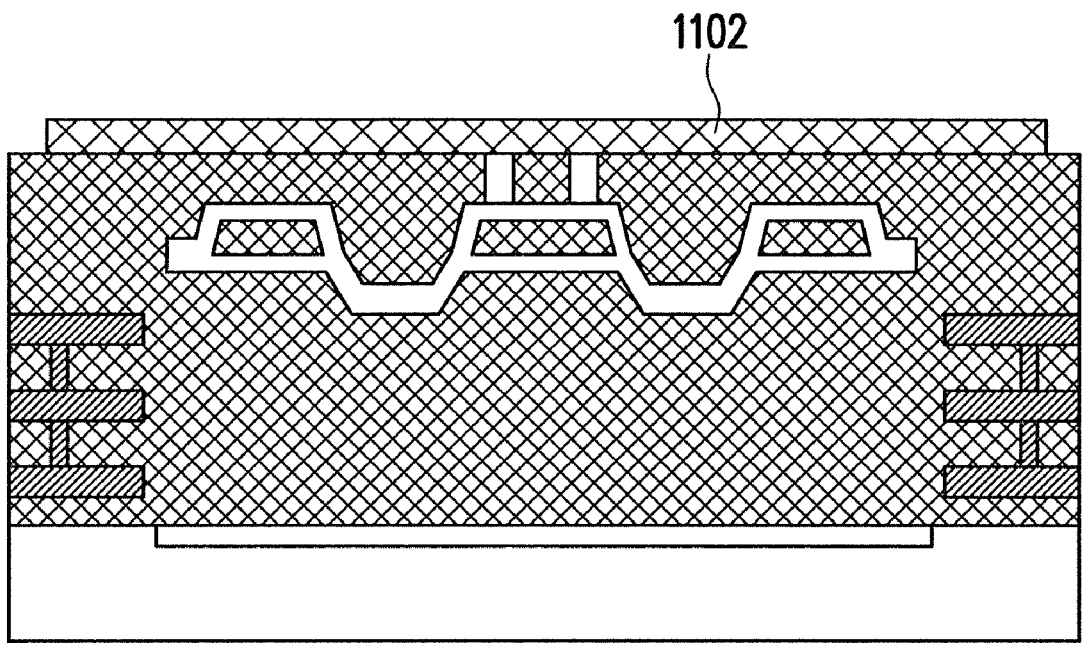
Figure 24C:
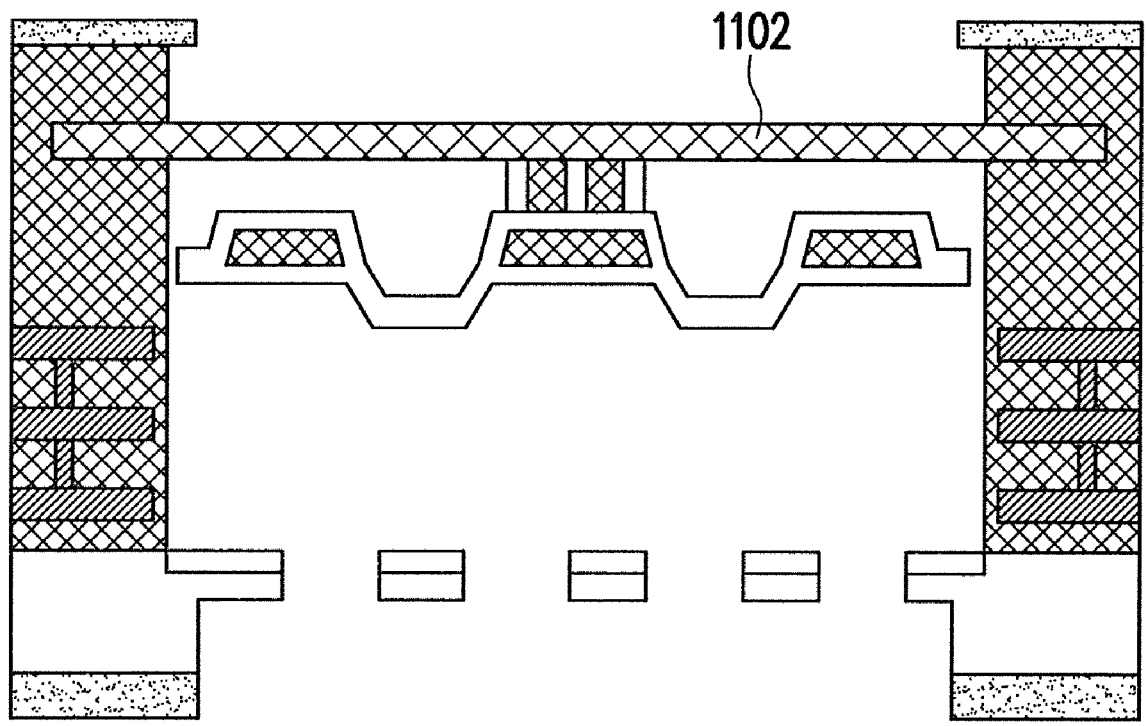

The foregoing process is just an example to form one of the various structures of MEMS device. The structures of MEMS device can be formed by semiconductor fabrication processes. However, the actual fabrication processes be taken may be different in options. Another fabrication process can also be taken and even result in different structure. In FIG. 24A, it can continue from FIG. 23F, the opening 1028 is filled with metal plug 1100, such as the tungsten plug 1100. The plug 110 can be formed by depositing a metal layer to fill the openings 1028 and then a planarization, such as the chemical mechanical polishing (CMP) process, can be done to planarize the metal layer into the metal plug 1100. The metal plug 1100 is adhered with the metal layer of the diaphragm. Then a suspension layer 1102 is formed on the planar surface of the dielectric layer and the metal plug 1100. The metal plug can be considered as a part of the suspension layer for the joint structure. In FIG. 24C, perform the same subsequent fabrication processes, finally an isotropic etching process is then performed to form the chamber and the cavity, in which venting holes allows the isotropic etching process to etch the dielectric from the backside of the substrate.

Figure 25A:
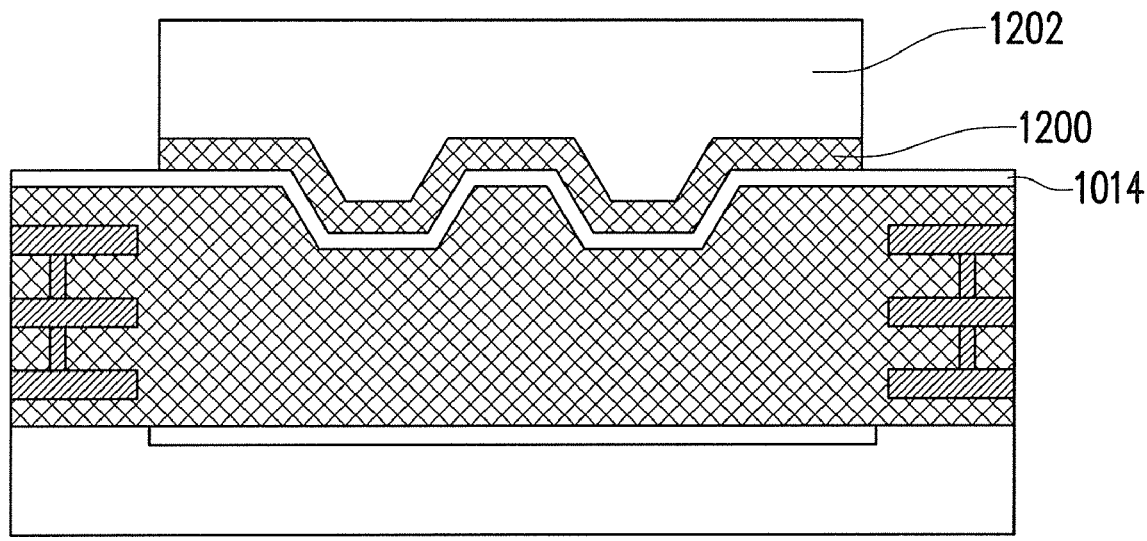
Figure 25B:
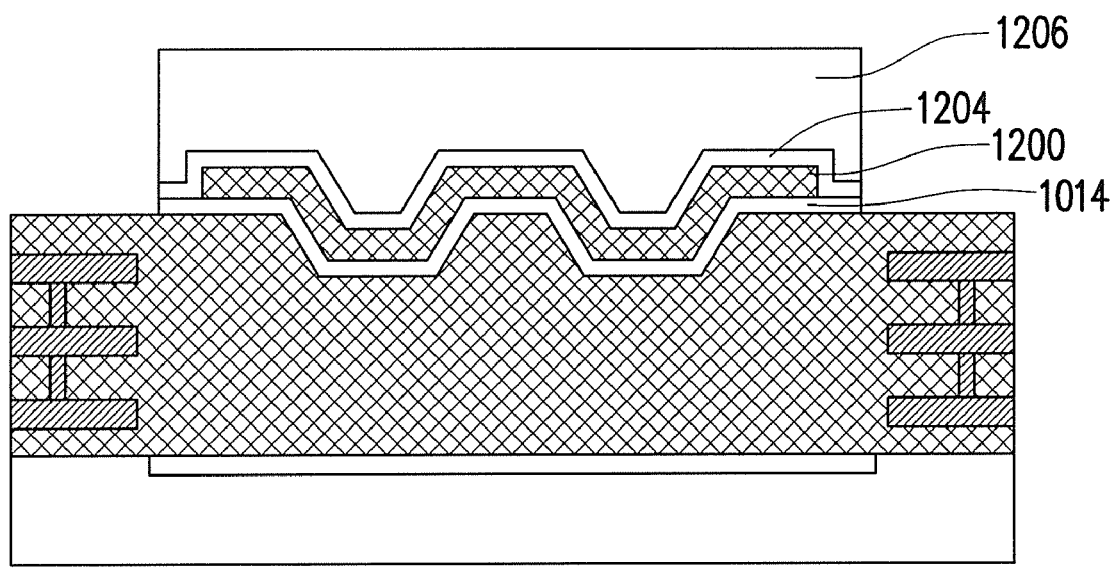
Figure 25C:
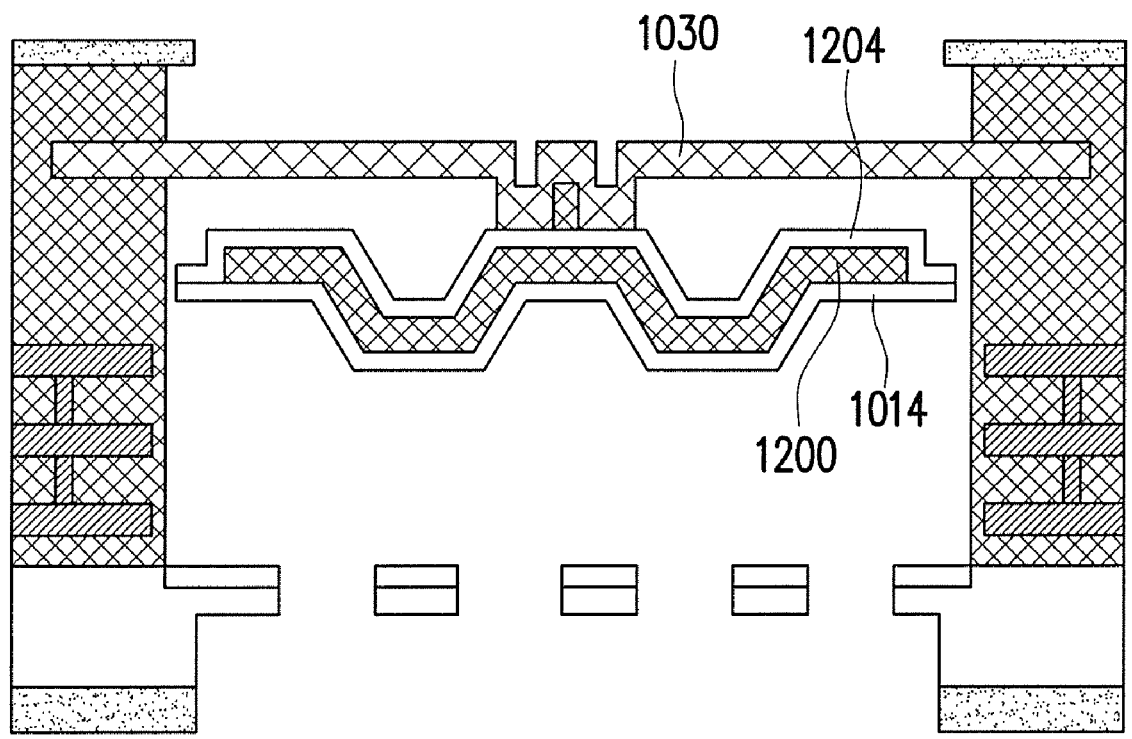

Further in FIG. 25A, another fabrication process can start after the process in FIG. 23C. A dielectric layer 1200 is conformally formed over the metal layer 1014 with the indent trenches. The dielectric layer 1200 is then patterned by using the photoresist layer 1202 to remove a portion of the dielectric layer 1200 and expose a portion of the metal layer 1014. In FIG. 25B, another metal layer 1204 formed over the dielectric layer 1200 and the metal layer 1014 to enclose the dielectric layer 1200, in which the end portion of the metal layer 1014 and the metal layer 1204 are contacting together. The metal layer 1204 and 1014 are patterned by etching with the photoresist layer 1206 as the etching mask. As a result, the corrugated diaphragm is formed. In FIG. 25C, perform the same subsequent fabrication processes, the suspension layer 1030 hold the diaphragm layer, having the metal layers 1014 and 1204 and the enclosed dielectric layer 1200.

Figure 26A:
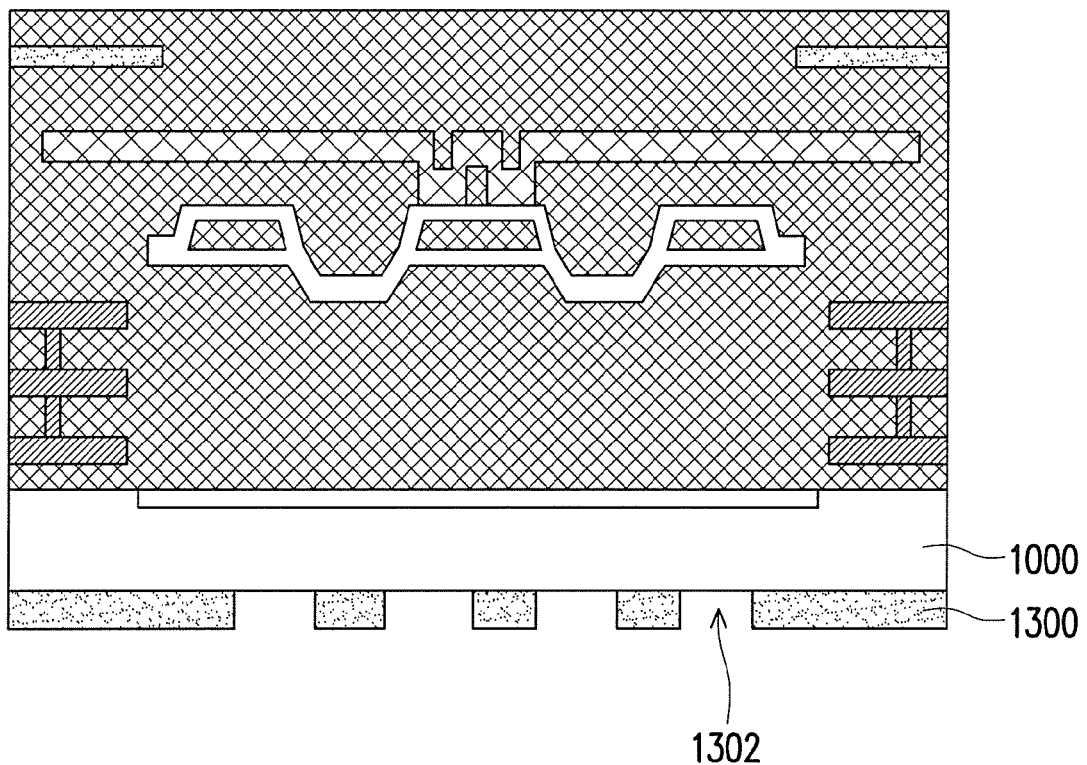
Figure 26B:
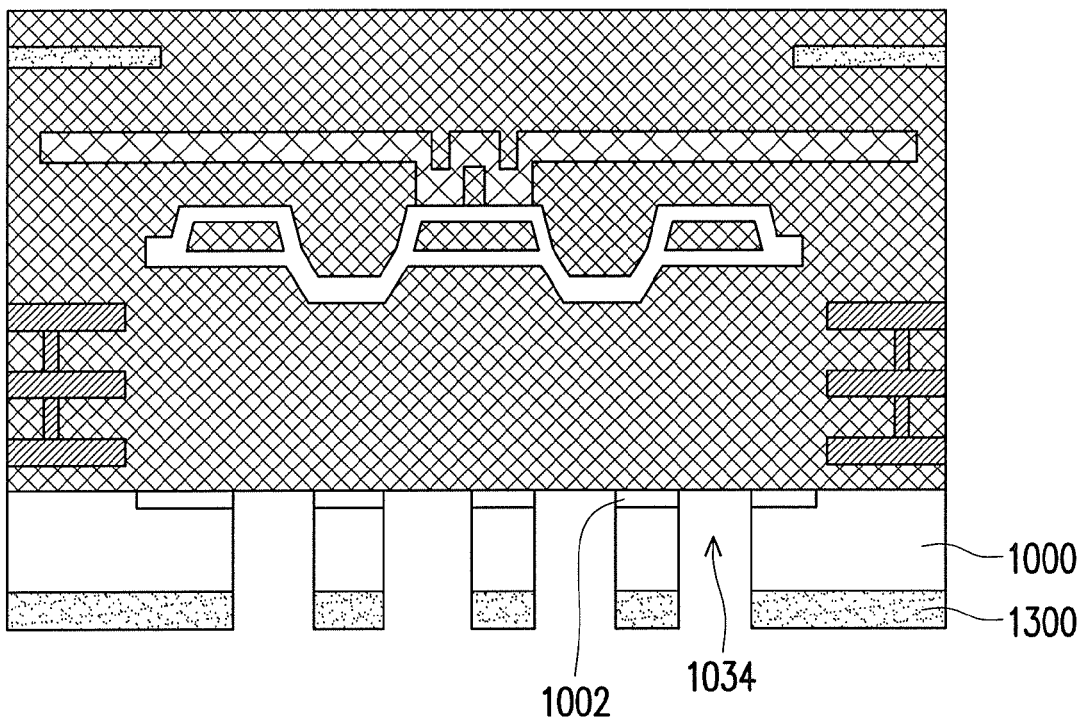
Figure 26C:
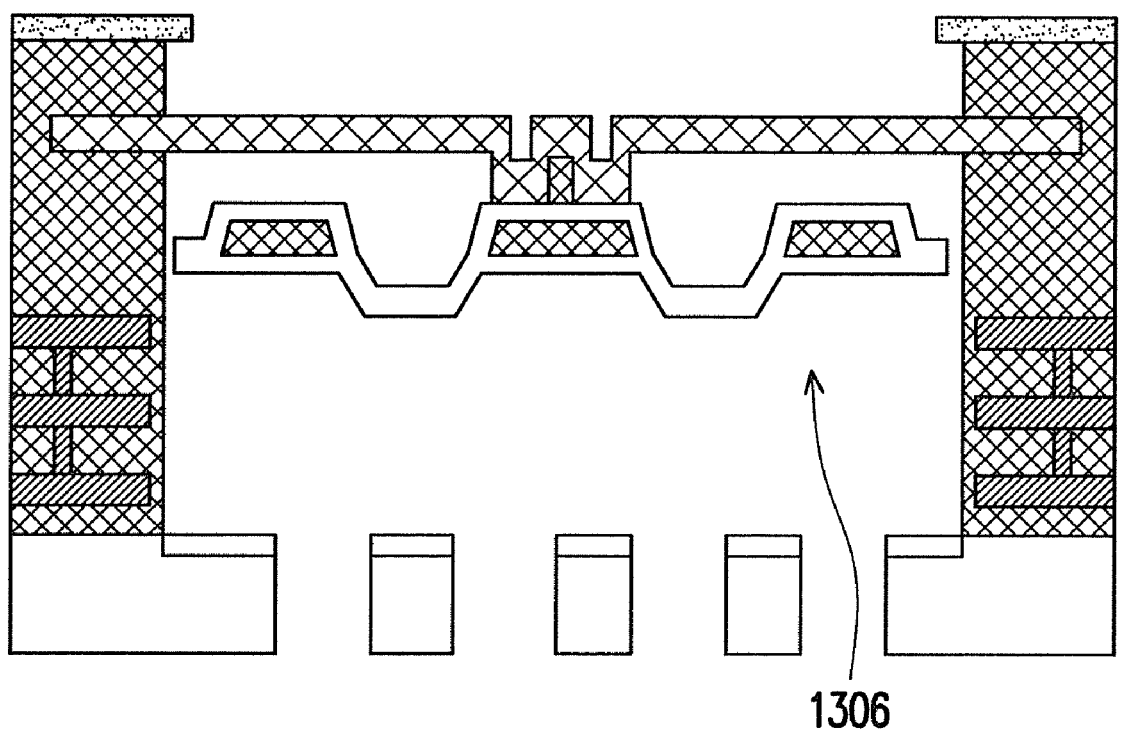

Alternatively in FIG. 26A, it continues from process in FIG. 23J. The etch mask layer 1300 is formed on the backside of the substrate 1000 with the openings 1302 to expose the substrate 1000. The openings 1302 are corresponding to the venting holes to be formed later. In FIG. 26B, the substrate 1000 is etched by anisotropic etching process to form the opening 1034 to expose the dielectric layer. In FIG. 26C, an isotropic etching process is performed to remove a portion of the structural dielectric layer to expose the suspension layer and the diaphragm while a chamber 1306 is formed in connecting with the venting holes. The etch mask layer 1300 may be removed in option. In this embodiment, the cavity in the substrate is not necessary. The chamber is connected to the environment by the venting holes without going through the cavity.

Figure 27A:
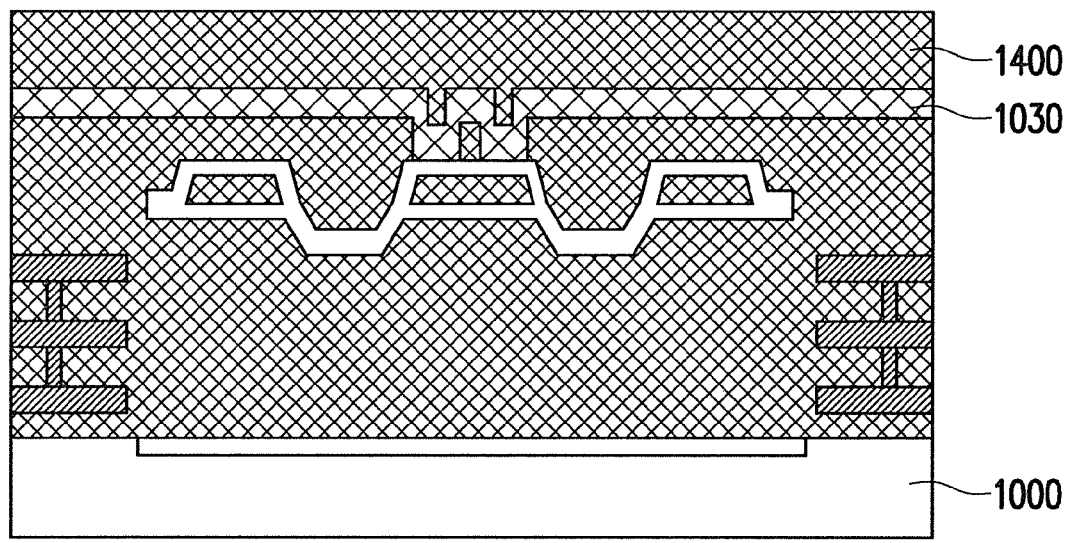
Figure 27B:
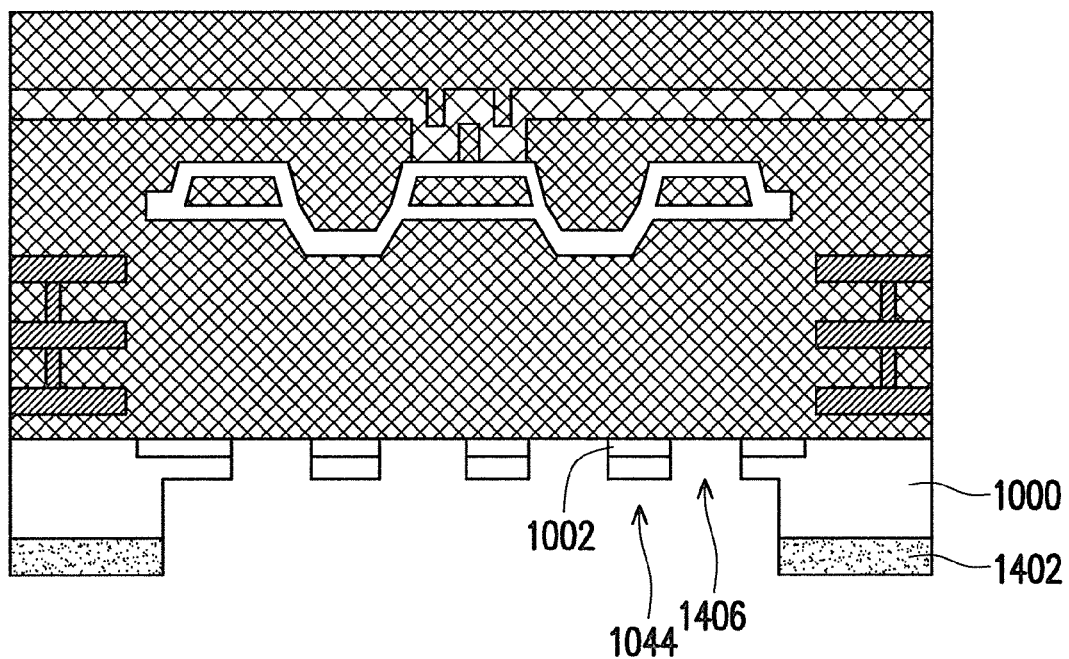
Figure 27C:
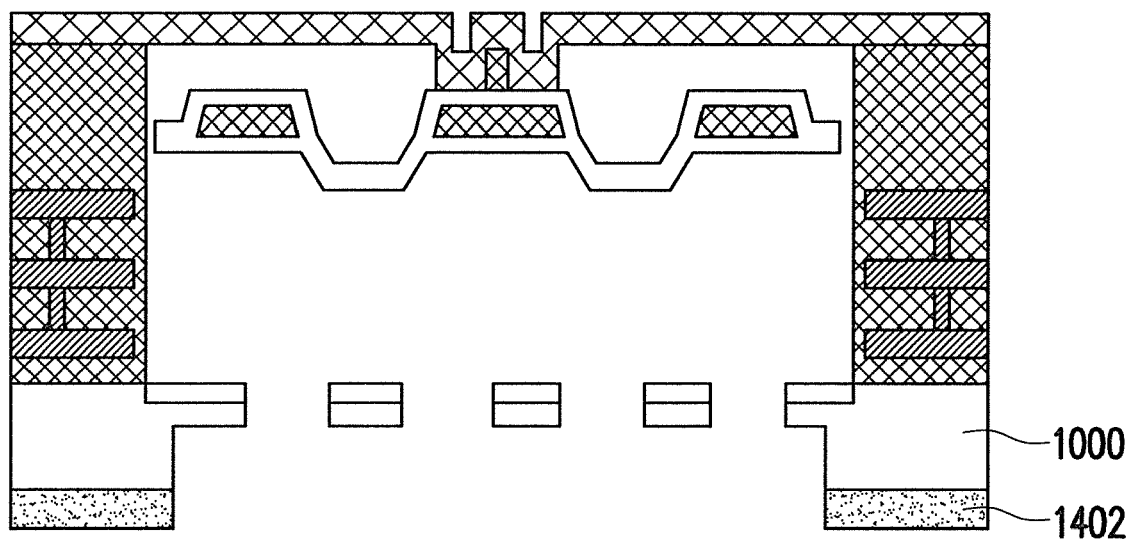

Further in FIG. 27A, it continues from the process in FIG. 23F. After the photoresist layer 1026 is removed, a suspension layer 1030 is formed over the structural dielectric layer and also fills into the openings. There is no need to form the etching stop layer on the dielectric layer 1400. In FIG. 27B, using the known fabrication processes to pattern the substrate 1000 to have the venting holes 1406 and the cavity 1044. In FIG. 27C, an isotropic etching process is performed to remove a portion of the structural dielectric layer so that the suspension layer and the diaphragm are exposed. Here, since there is no etching stop layer on the top dielectric layer. There is no residual dielectric on top of the suspension layer. However, the suspension layer is still clamped by the structural dielectric layer at the fixed position.

Figure 28A:
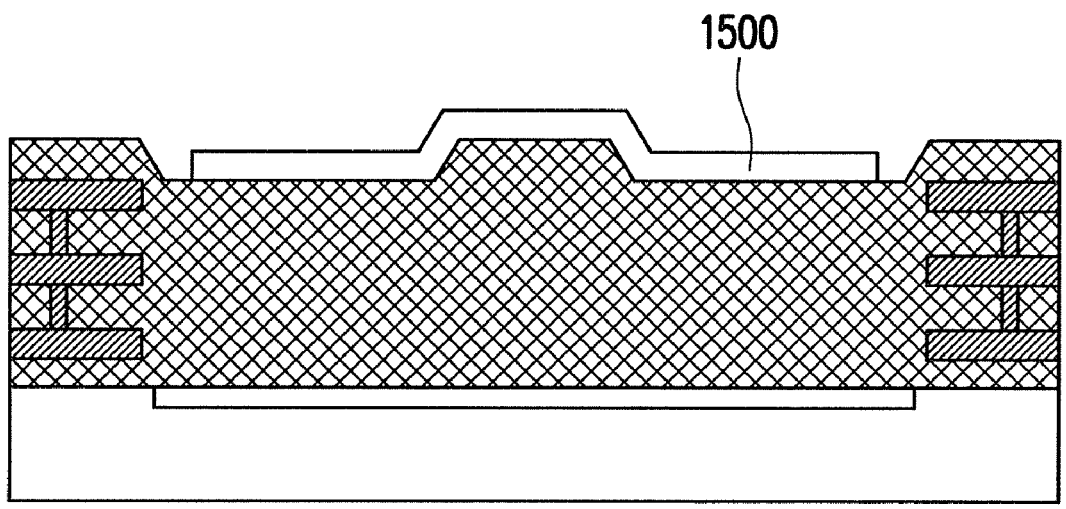
Figure 28B:
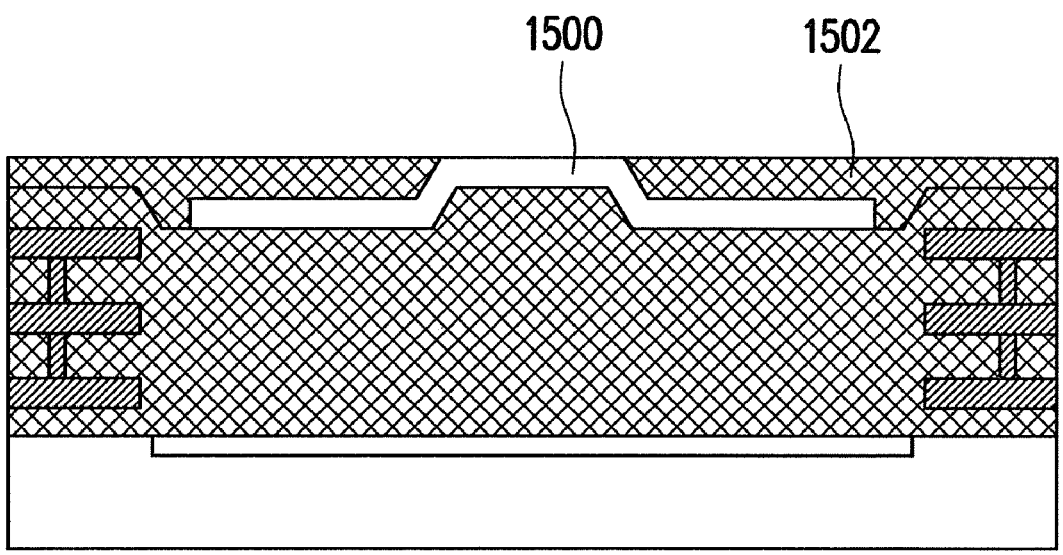
Figure 28C:
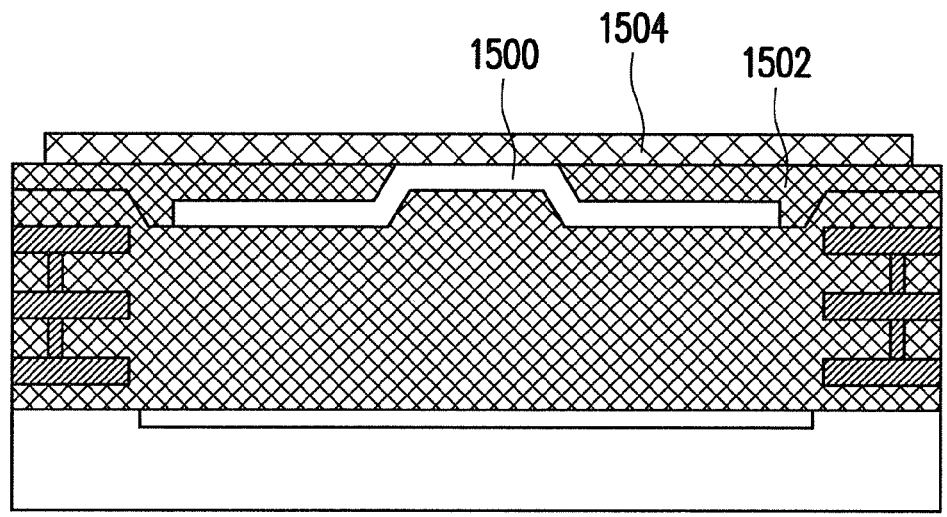
Figure 28D:
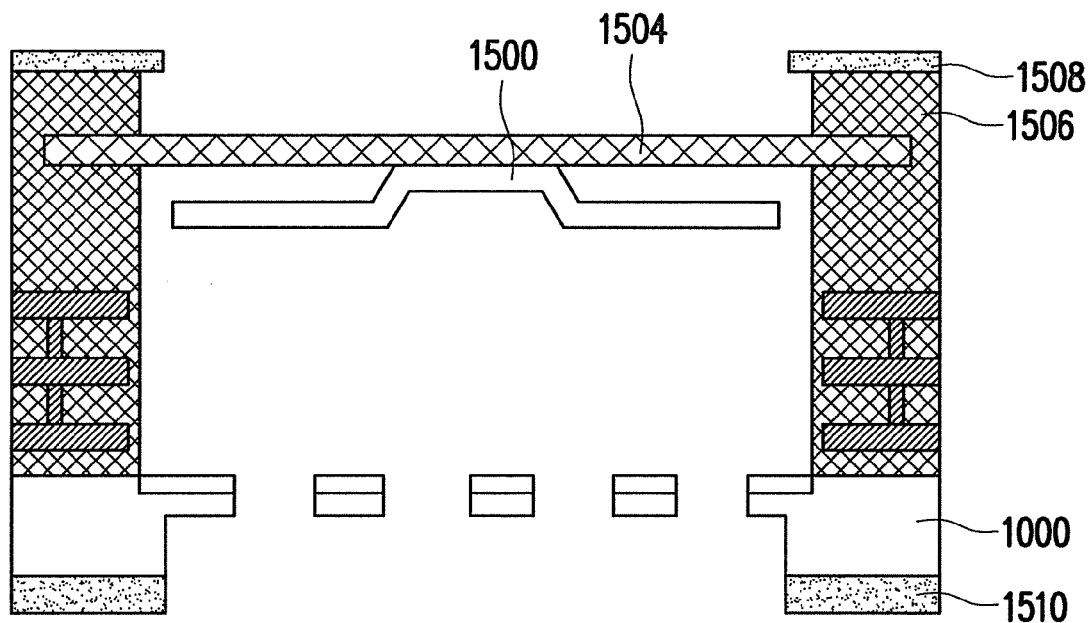

In addition in FIG. 28A, for the structure in FIG. 5 as the example, the metal layer 1500 is formed on the dielectric layer, based on the FIG. 23C. In FIG. 28B, another dielectric layer 1502 is formed over the metal layer 1500 with planarization by i.e. CMP process to expose the metal layer 1500. In FIG. 28C, a suspension layer 1504 is formed in the planarized surface, wherein the exposed portion of the metal layer 1500 is connected to the suspension layer 1504. In FIG. 28D, another dielectric layer 1506 is formed over the suspension layer 1504 and an etching stop layer 1508 is formed on the dielectric layer 1506. The cavity and the venting holes in the substrate 1000 are formed by the usual processes as previously described. An isotropic etching process is performed to expose the suspension layer 1504 and the metal layer 1500, serving as the diaphragm held by the suspension layer 1504.

In this embodiment, the suspension layer 1504 is flat but the diaphragm 1500 is protruding in joining to the suspension layer 1504.

Figure 29A:
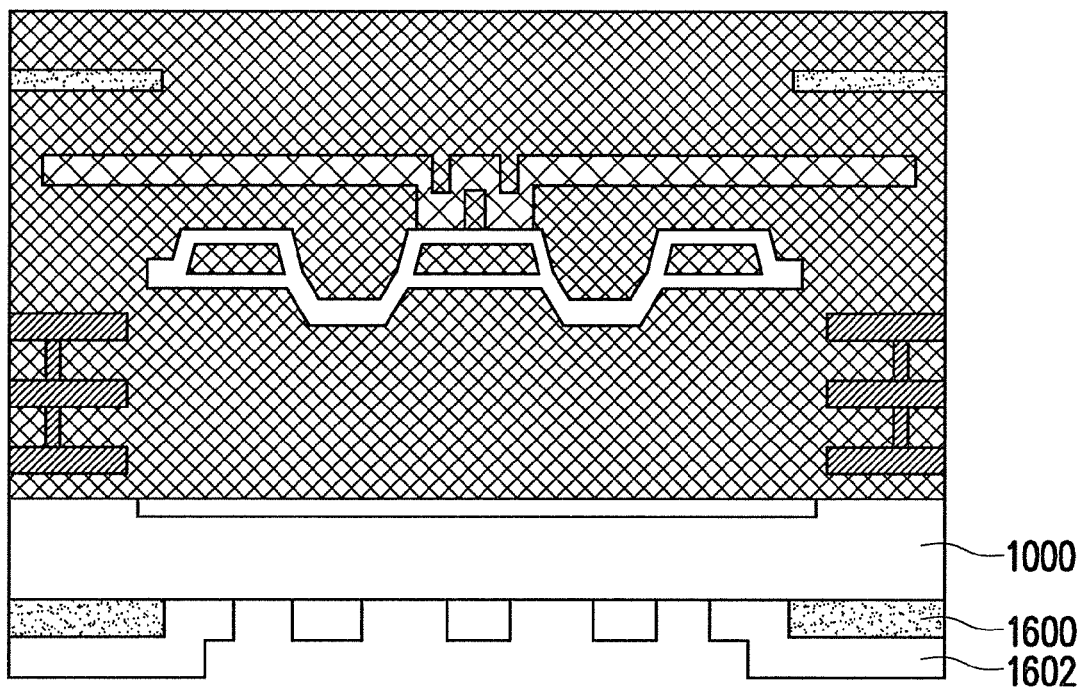
Figure 29B:
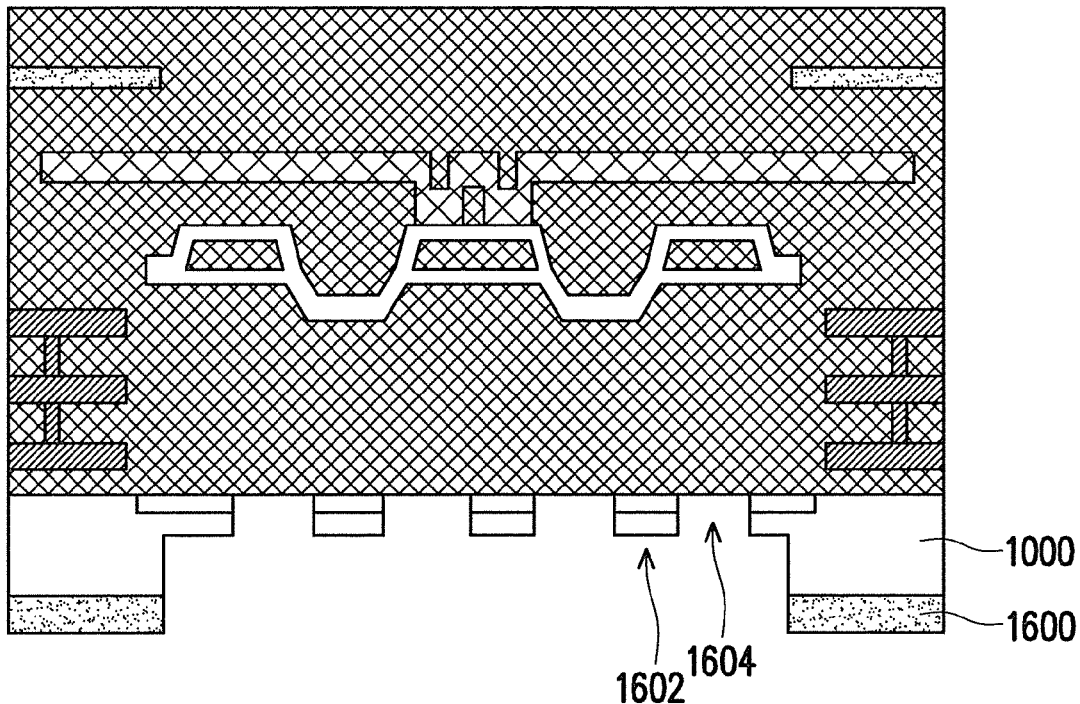
Figure 29C:
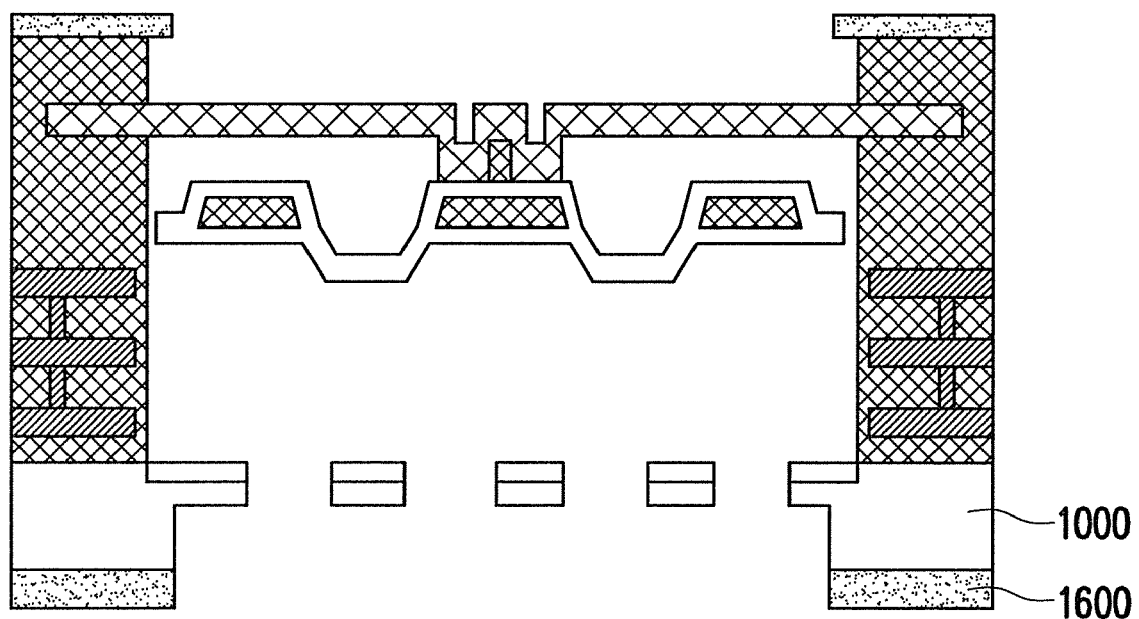

In FIG. 29A, the process to pattern the substrate 1000 has other fabrication flow. For example, the first etch mask layer 1600 is formed on the substrate 1000 with the opening corresponding to a cavity to be formed. A second etch mask layer 1602 is formed over the substrate 1000 and the second etch mask layer 1600. The second etch mask layer 1602 has openings to expose the substrate 1000, corresponding to the venting holes to be form later. In FIG. 29B, anisotropic etching process is performed to etch the substrate 1000 and the second etch mask layer 1602 into step structure by etching away the second etching mask in the middle of etching process, having the cavity 1602 in the substrate 1000 and the venting holes 1604 in the back plate within the cavity 1046, and expose the structure dielectric layer. In FIG. 29C, similarly, the isotropic etching process is performed to expose the suspension layer and the diaphragm.

Figure 30A:
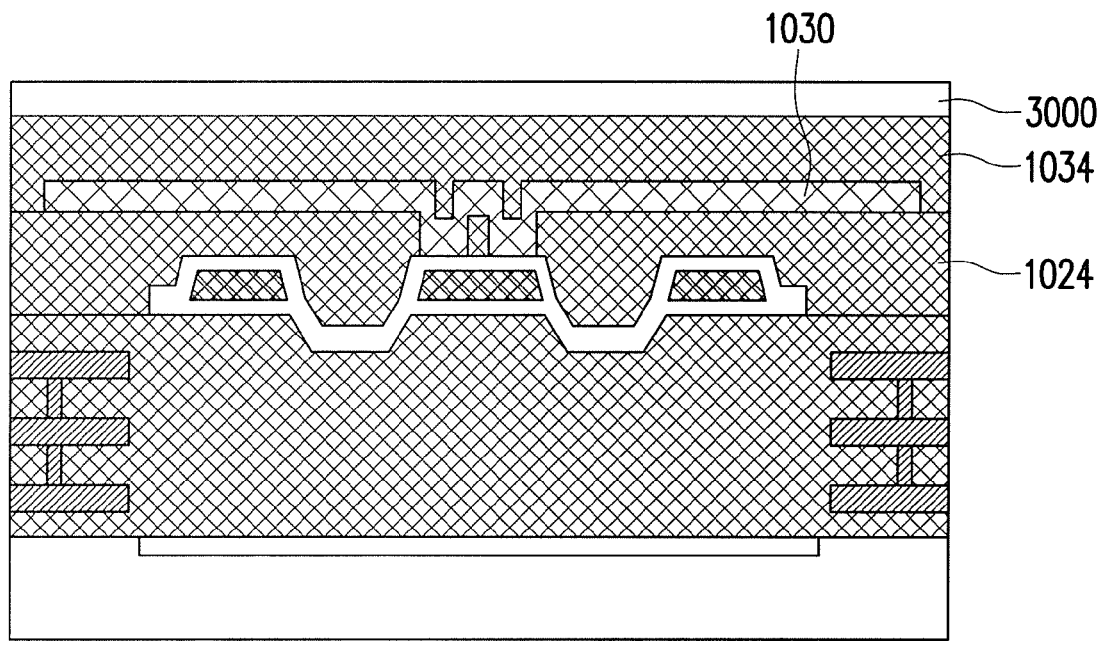
Figure 30B:
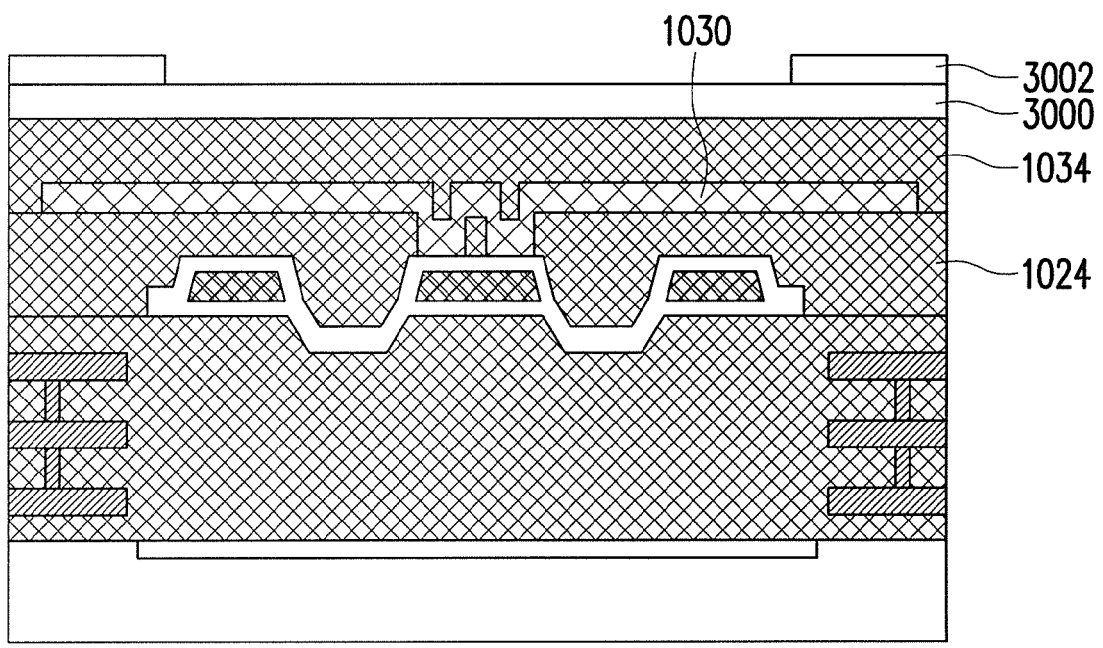
Figure 30C:
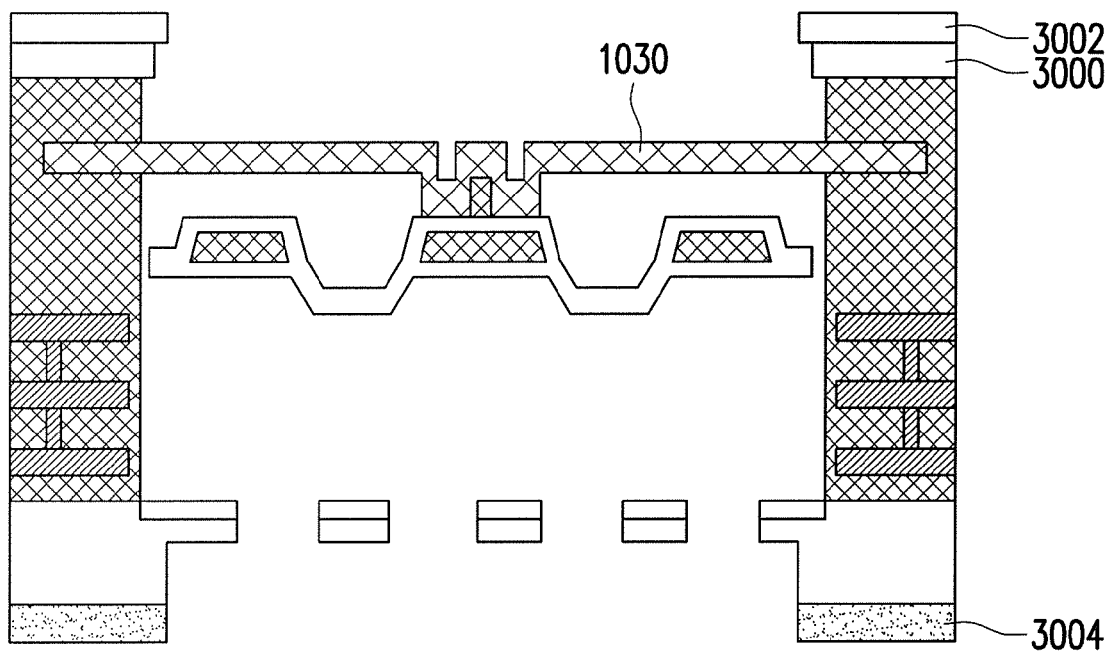

Further, in FIG. 30A, after the process in FIG. 23H is done, another film layer 3000, such as the dielectric layer in different material, is formed over the dielectric layer 1034. In FIG. 30B, the etching stop layer 3002 is formed over the film layer 3000 with the pattern to expose a portion of the film layer 3000. In FIG. 30C, likewise, another etching stop layer 3004 is formed on the back side of the substrate. Then, an isotropic etching process is performed to etch the dielectric layer and the film layer 3000 to expose the suspension layer 1030 with the diaphragm. The MEMS structure is then accomplished.

In a preferred embodiment, the film layer 3000 can be harder than the dielectric layer 1034 in etching process, so that the etching rate of the film layer 3000 is smaller. This can reduce the effect at the side etching.

The forgoing provided embodiments can be properly combined to each other for another embodiment. The present invention proposes that the diaphragm is locally attached to the suspension layer. As a result, the diaphragm can be free in better degree for sensing the acoustic pressure.

What is claimed is:

1. A method for fabricating a micro-electro-mechanical system (MEMS) device, comprising:
   forming a first structural dielectric layer on a substrate;
   patterning the first structural dielectric layer to have a plurality of indent regions without penetrating through the first structural dielectric layer;
   forming a conductive diaphragm layer, wherein the conductive diaphragm layer has a corrugated structure corresponding to the indent regions, wherein the step of forming the conductive diaphragm layer comprises:
      forming a first conductive layer on the first structural dielectric layer;
      forming an inter-dielectric layer on the first conductive layer; and
      forming a second conductive layer to cover the inter-dielectric layer, wherein the second conductive layer and the first conductive layer enclose the inter-dielectric layer;
   forming a second structural dielectric layer on the first structural dielectric layer and the conductive diaphragm layer;
   forming an etching mask layer on the substrate at a back surface, wherein the etching mask layer has a plurality of openings to expose the substrate, in which the openings are at positions corresponding to venting holes to be formed later; and
   performing an anisotropic etching process to at least etch the substrate to expose the first structural dielectric layer, wherein the substrate has the venting holes being formed.

2. The method of claim 1, wherein the step of forming the inter-dielectric layer comprises:
   forming a dielectric layer over the first conductive layer; and
   patterning the dielectric layer into a plurality of dielectric islands on the first conductive layer, adjacent to the indent regions.

3. The method of claim 1, wherein the step of forming the inter-dielectric layer comprises:
   forming a dielectric layer over the first conductive layer; and
   patterning the dielectric layer into a plurality of dielectric islands on the first conductive layer, wherein the dielectric islands cover a portion of the indent regions.

4. The method of claim 1, wherein the step of forming the inter-dielectric layer comprises:
   forming a dielectric layer over the first conductive layer being conformal with the indent regions; and
   patterning the dielectric layer to expose a portion of the first conductive layer, wherein a remaining portion of the dielectric layer as the inter-dielectric layer also fully covers the indent regions.

5. The method of claim 1, wherein the first and second conductive layers are formed by polysilicon or metal.

6. The method of claim 1, wherein the first structural dielectric layer comprises an embedded conductive structure layer.

7. The method of claim 1, wherein the second structural dielectric layer comprises an embedded conductive structure layer.

8. The method of claim 1, wherein in the step of forming the etching mask layer, the etching mask layer is a single etching mask layer.

9. The method of claim 1, wherein in the etching mask layer comprises a hard mask layer or photoresist layer.

10. The method of claim 1, wherein in the step of forming the etching mask layer, the etching mask layer has a thicker step region, surrounding the openings and corresponding to a cavity to be also formed.

11. The method of claim 10, wherein in the etching mask layer comprises two mask layers.

12. The method of claim 11, wherein in two mask layers comprises at least two hard mask layers or two photo resistor layers.

13. The method of claim 11, wherein in two mask layers comprises at least a hard mask layer and a photo resistor layer.

14. The method of claim 10, wherein the step of performing the anisotropic etching process also etches the etching mask layer to further expose the substrate and then etches the substrate just being exposed, wherein the thicker step region has a residual portion remains on the substrate.

15. The method of claim 10, wherein the thicker step region of the etching mask layer is formed by the steps of:
   forming a first mask layer with the openings, corresponding to the venting holes; and
   forming a second mask layer on the first mask layer, corresponding to the cavity.

16. The method of claim 10, wherein the thicker step region of the etching mask layer is formed by the steps of:
   forming a first mask layer with a first opening to expose the substrate, corresponding to the cavity; and forming a second mask layer on the first mask layer and the substrate, wherein the second mask layer has the openings, corresponding to the venting holes, to expose the substrate.

17. The method of claim 1, wherein in the step of forming the second structural dielectric layer, a suspension layer is embedded in the second structural dielectric layer to adhere to a portion of the conductive diaphragm layer.

18. The method of claim 17, wherein the suspension layer has a protrusion portion to adhere to the portion of the conductive diaphragm layer.

19. A method for fabricating a micro-electro-mechanical system (MEMS) device comprising;
   forming a first structural dielectric layer on a substrate;
   patterning the first structural dielectric layer to have a plurality of indent regions without penetrating through the first structural dielectric layer;
   forming a conductive diaphragm layer, wherein the conductive diaphragm layer has a corrugated structure corresponding to the indent regions;
   forming a second structural dielectric layer on the first structural dielectric layer and the conductive diaphragm layer, wherein a suspension layer is embedded in the second structural dielectric layer, and the suspension layer has a protrusion portion to adhere to a portion of the conductive diaphragm layer;
   forming an etching mask layer on the substrate at a back surface, wherein the etching mask layer has a plurality of openings to expose the substrate, in which the openings are at positions corresponding to venting holes to be formed later;
   performing an anisotropic etching process to at least etch the substrate to expose the first structural dielectric layer, wherein the substrate has the venting holes being formed; and
   performing an isotropic etching process to release the conductive diaphragm and the suspension layer, wherein the protrusion portion of the suspension layer holds the conductive diaphragm layer and a peripheral end portion of the suspension layer is clamped between the first structural dielectric layer and the second structural dielectric layer.

* * * * *